(12) United States Patent
Chen et al.

(10) Patent No.: US 7,230,480 B2
(45) Date of Patent: Jun. 12, 2007

(54) ESTIMATING THE OPERATING POINT ON A NON-LINEAR TRAVELING WAVE TUBE AMPLIFIER

(75) Inventors: Ernest C. Chen, San Pedro, CA (US); Shamik Maitra, Redondo Beach, CA (US)

(73) Assignee: The DirecTV Group, Inc., El Segundo, CA (US)

( * ) Notice: Subject to any disclaimer, the term of this patent is extended or adjusted under 35 U.S.C. 154(b) by 16 days.

(21) Appl. No.: 10/532,509

(22) PCT Filed: Oct. 17, 2003

(86) PCT No.: PCT/US03/33130

§ 371 (c)(1),
(2), (4) Date: Apr. 25, 2005

(87) PCT Pub. No.: WO2004/040406

PCT Pub. Date: May 13, 2004

(65) Prior Publication Data

US 2006/0022747 A1 Feb. 2, 2006

Related U.S. Application Data

(60) Provisional application No. 60/510,368, filed on Oct. 10, 2003, provisional application No. 60/421,289, filed on Oct. 25, 2002.

(51) Int. Cl.
*H03F 3/58* (2006.01)
(52) U.S. Cl. .............................. 330/43; 330/2
(58) Field of Classification Search .................. 330/2, 330/41, 42, 43, 44, 136, 149
See application file for complete search history.

(56) References Cited

U.S. PATENT DOCUMENTS 3,076,180 A * 1/1963 Havens et al. ................. 365/73
3,383,598 A 5/1968 Sanders
3,878,468 A 4/1975 Falconer et al.

(Continued)

FOREIGN PATENT DOCUMENTS

DE 3642213 12/1986

(Continued)

OTHER PUBLICATIONS

Janssen, G.J.M; Slimane, S.B.: "Performance of a Multiuser Detector for M-PSK Signals Based on Successive Cancellation", ICC 2001, 2001 IEEE International Conference on Communications, Conference Record, Helsinky, Finland, Jun. 11-14, 2001, XP010552960.

Slimane, S.B.; Janssen, G.J.M.: "Power Optimization of M-PSK Cochannel Signals for a Narrowband Multiuser Detector", 2001 IEEE Pacific Rim Conference on Communications, Computer and Signal Processing, Victoria, B.C., Canada, Aug. 26-28, 2001, XP010560334.

(Continued)

*Primary Examiner*—Henry Choe
(74) *Attorney, Agent, or Firm*—Georgann S. Grunebach

(57) ABSTRACT

A method, apparatus, article of manufacture, and a memory structure provide the ability to determine an input operating point and an output operating point on a non-linear traveling wave tube amplifier (TWTA). The non-linearity of the TWTA is measured. An input roots mean-square (RMS) value of an input signal used to measure the non-linearity of the TWTA is computed. The RMS value identifies an input operating point of the measured non-linearity of the TWTA. Lastly, an output operating point is obtained.

48 Claims, 23 Drawing Sheets

U.S. PATENT DOCUMENTS

| | | |
|---|---|---|
| 3,879,664 A | 4/1975 | Monsen |
| 3,974,449 A | 8/1976 | Falconer |
| 4,039,961 A | 8/1977 | Ishio et al. |
| 4,068,186 A | 1/1978 | Sato et al. |
| 4,213,095 A | 7/1980 | Falconer |
| 4,253,184 A | 2/1981 | Gitlin et al. |
| 4,283,684 A | 8/1981 | Satoh |
| 4,384,355 A | 5/1983 | Werner |
| RE31,351 E | 8/1983 | Falconer |
| 4,416,015 A | 11/1983 | Gitlin |
| 4,500,984 A | 2/1985 | Shimbo et al. |
| 4,519,084 A | 5/1985 | Langseth |
| 4,594,725 A | 6/1986 | Desperben et al. |
| 4,628,507 A | 12/1986 | Otani |
| 4,637,017 A | 1/1987 | Assal et al. |
| 4,647,873 A | 3/1987 | Beckner et al. |
| 4,654,863 A | 3/1987 | Belfield et al. |
| 4,670,789 A | 6/1987 | Plume |
| 4,709,374 A | 11/1987 | Farrow |
| 4,800,573 A | 1/1989 | Cupo |
| 4,835,790 A | 5/1989 | Yoshida et al. |
| 4,847,864 A | 7/1989 | Cupo |
| 4,860,315 A | 8/1989 | Hosoda et al. |
| 4,878,030 A | 10/1989 | Vincze |
| 4,896,369 A | 1/1990 | Adams et al. |
| 4,918,708 A | 4/1990 | Pottinger et al. |
| 4,993,047 A | 2/1991 | Moffatt et al. |
| 5,088,110 A | 2/1992 | Bonnerot et al. |
| 5,111,155 A | 5/1992 | Keate et al. |
| 5,121,414 A | 6/1992 | Levine et al. |
| 5,199,047 A | 3/1993 | Koch |
| 5,221,908 A | 6/1993 | Katz et al. |
| 5,229,765 A | 7/1993 | Gardner |
| 5,233,632 A | 8/1993 | Baum et al. |
| 5,285,480 A | 2/1994 | Chennakeshu et al. |
| 5,317,599 A | 5/1994 | Obata |
| 5,329,311 A | 7/1994 | Ward et al. |
| 5,430,770 A | 7/1995 | Abbey |
| 5,450,623 A | 9/1995 | Yokoyama et al. |
| 5,467,197 A | 11/1995 | Hoff |
| 5,493,307 A | 2/1996 | Tsujimoto |
| 5,555,257 A | 9/1996 | Dent |
| 5,577,067 A | 11/1996 | Zimmerman |
| 5,577,087 A | 11/1996 | Furuya |
| 5,579,344 A | 11/1996 | Namekata |
| 5,581,229 A | 12/1996 | Hunt |
| 5,602,868 A | 2/1997 | Wilson |
| 5,603,084 A | 2/1997 | Henry et al. |
| 5,606,286 A | 2/1997 | Bains |
| 5,625,640 A | 4/1997 | Palmer et al. |
| 5,642,358 A | 6/1997 | Dent |
| 5,648,955 A | 7/1997 | Jensen et al. |
| 5,732,113 A | 3/1998 | Schmidl et al. |
| 5,793,818 A | 8/1998 | Claydon et al. |
| 5,815,531 A | 9/1998 | Dent |
| 5,819,157 A | 10/1998 | Ben-Efraim et al. |
| 5,828,710 A | 10/1998 | Beale |
| 5,848,060 A | 12/1998 | Dent |
| 5,870,443 A | 2/1999 | Rahnema |
| 5,940,025 A | 8/1999 | Koehnke et al. |
| 5,956,373 A | 9/1999 | Goldston et al. |
| 5,960,040 A | 9/1999 | Cai et al. |
| 5,963,845 A | 10/1999 | Floury et al. |
| 5,966,048 A | 10/1999 | Thompson |
| 5,966,186 A | 10/1999 | Shigihara et al. |
| 5,966,412 A | 10/1999 | Ramaswamy |
| 5,970,098 A | 10/1999 | Herzberg |
| 5,987,068 A | 11/1999 | Cassia et al. |
| 5,995,832 A | 11/1999 | Mallinckrodt |
| 5,999,793 A | 12/1999 | Ben-Efraim et al. |
| 6,008,692 A | 12/1999 | Escartin |
| 6,018,556 A | 1/2000 | Janesch et al. |
| 6,021,159 A | 2/2000 | Nakagawa |
| 6,028,894 A | 2/2000 | Oishi et al. |
| 6,032,026 A | 2/2000 | Seki et al. |
| 6,034,952 A | 3/2000 | Dohi et al. |
| 6,049,566 A | 4/2000 | Saunders et al. |
| 6,052,586 A | 4/2000 | Karabinis |
| 6,055,278 A | 4/2000 | Ho et al. |
| 6,061,393 A | 5/2000 | Tsui et al. |
| 6,084,919 A | 7/2000 | Kleider et al. |
| 6,108,374 A | 8/2000 | Balachandran et al. |
| 6,125,148 A | 9/2000 | Frodigh et al. |
| 6,128,357 A | 10/2000 | Lu et al. |
| 6,131,013 A | 10/2000 | Bergstrom et al. |
| 6,140,809 A | 10/2000 | Doi |
| 6,141,534 A | 10/2000 | Snell et al. |
| 6,144,708 A | 11/2000 | Maruyama |
| 6,166,601 A | 12/2000 | Shalom et al. |
| 6,178,158 B1 | 1/2001 | Suzuki et al. |
| 6,188,717 B1 | 2/2001 | Kaiser et al. |
| 6,212,360 B1 | 4/2001 | Fleming et al. |
| 6,219,095 B1 | 4/2001 | Zhang et al. |
| 6,249,180 B1 | 6/2001 | Maalej et al. |
| 6,266,534 B1 | 7/2001 | Raith et al. |
| 6,272,679 B1 | 8/2001 | Norin |
| 6,275,678 B1 | 8/2001 | Bethscheider et al. |
| 6,297,691 B1 | 10/2001 | Anderson et al. |
| 6,304,594 B1 | 10/2001 | Salinger |
| 6,307,435 B1 | 10/2001 | Nguyen et al. |
| 6,320,919 B1 | 11/2001 | Khyrallah et al. |
| 6,325,332 B1 | 12/2001 | Cellier et al. |
| 6,330,336 B1 | 12/2001 | Kasama |
| 6,333,924 B1 | 12/2001 | Porcelli et al. |
| 6,366,309 B1 | 4/2002 | Siegle |
| 6,369,648 B1 * | 4/2002 | Kirkman ..................... 330/43 |
| 6,389,002 B1 | 5/2002 | Schilling |
| 6,411,659 B1 | 6/2002 | Liu et al. |
| 6,411,797 B1 | 6/2002 | Estinto |
| 6,426,822 B1 | 7/2002 | Winter et al. |
| 6,429,740 B1 | 8/2002 | Nguyen et al. |
| 6,433,835 B1 | 8/2002 | Hartson et al. |
| 6,477,398 B1 * | 11/2002 | Mills .......................... 600/409 |
| 6,501,804 B1 | 12/2002 | Rudolph et al. |
| 6,515,713 B1 | 2/2003 | Nam |
| 6,522,683 B1 | 2/2003 | Smee et al. |
| 6,535,497 B1 | 3/2003 | Raith |
| 6,535,801 B1 | 3/2003 | Geier et al. |
| 6,574,235 B1 | 6/2003 | Arslan et al. |
| 6,597,750 B1 | 7/2003 | Knutson et al. |
| 6,718,184 B1 | 4/2004 | Aiken et al. |
| 6,731,700 B1 | 5/2004 | Yakhnich et al. |
| 6,745,050 B1 | 6/2004 | Forsythe et al. |
| 6,775,521 B1 | 8/2004 | Chen |
| 6,892,068 B2 | 5/2005 | Karabinis et al. |
| 6,934,314 B2 | 8/2005 | Harles et al. |
| 6,956,841 B1 | 10/2005 | Stahle et al. |
| 6,970,496 B1 | 11/2005 | Ben-Bassat et al. |
| 7,154,958 B2 | 12/2006 | Dabak et al. |
| 7,161,931 B1 | 1/2007 | Li et al. |
| 2001/0012322 A1 | 8/2001 | Nagaoka et al. |
| 2001/0024479 A1 | 9/2001 | Samarasooriya |
| 2002/0006795 A1 | 1/2002 | Norin et al. |
| 2002/0051435 A1 | 5/2002 | Giallorenzi et al. |
| 2002/0071506 A1 | 6/2002 | Lindquist et al. |
| 2002/0136327 A1 | 9/2002 | El-Gamal et al. |
| 2002/0176516 A1 | 11/2002 | Jeske et al. |
| 2003/0002471 A1 | 1/2003 | Crawford et al. |
| 2003/0138037 A1 | 7/2003 | Kaku et al. |
| 2003/0194022 A1 | 10/2003 | Hammons et al. |
| 2004/0110467 A1 | 6/2004 | Wang |
| 2004/0146014 A1 | 7/2004 | Hammons et al. |
| 2004/0146296 A1 | 7/2004 | Gerszberg et al. |
| 2005/0008100 A1 | 1/2005 | Chen |

| | | |
|---|---|---|
| 2006/0013333 A1 | 1/2006 | Chen |
| 2006/0056541 A1 | 3/2006 | Chen et al. |

FOREIGN PATENT DOCUMENTS

| | | |
|---|---|---|
| EP | 0222076 | 8/1986 |
| EP | 0238822 | 9/1987 |
| EP | 0356096 | 2/1990 |
| EP | 0929164 | 7/1999 |
| FR | 2696295 | 4/1994 |
| JP | 3-5631 | 1/1990 |
| JP | 2-95033 | 4/1990 |
| JP | 5-41683 | 2/1993 |
| JP | 5-114878 | 5/1993 |
| JP | 5-252084 | 9/1993 |
| JP | 07-038615 | 2/1995 |
| WO | WO 99/20001 | 4/1999 |
| WO | WO 01/80471 | 10/2001 |
| WO | WO 02/073817 | 9/2002 |
| WO | WO 03/105375 | 12/2003 |
| WO | WO 2005/074171 | 8/2005 |
| WO | WO 2005/086444 | 9/2005 |

OTHER PUBLICATIONS

Soong, A.C.K.; Krzymien, W.A.: "Performance of a Reference Symbol Assisted Multistage Successive Interference Cancelling Receiver in a Multicell CDMA Wireless System", Conference Record, Communication Theory Mini-Conference GlobeCom '95, IEEE Singapore Nov. 13-17, 1995, XP010159490.

Arslan, H; Molnar, K: "Iterative Co-channel Interference Cancellation in Narrowband Mobile Radio Systems", Emerging Technologies Symposium: Broadband, Wireless Internet Access, 2000 IEEE Apr. 10-11, 2000, Piscataway, New Jersey, US, XP010538900.

Mazzini, Gianluca: "Power Division Multiple Access", Universal Personal Communications, 1998, ICUPC 1998, IEEE 1998, International Conference on Florence, Italy, Oct. 5-9, 1998, New York, NY, US, IEEE, US Oct. 5, 1998, pp. 543-546, XP010314962 ISBN: 0-7803-5106-1.

Saleh, A.A.M. et al.: "Adaptive Linearization of Power Amplifiers in Digital Radio Systems", Bell System Technical Journal, American Telephone and Telegraph Co., New York, US, vol. 62, No. 4, Part 1, Apr. 1, 1983, pp. 1019-1033, XP002028354.

Ramchandran, Kannan et al.: Multiresolution Broadcast for Digital HDTV Using Joint Source/Channel Coding, IEEE, vol. 11, No. 1, Jan. 1993, pp. 6-22.

Meyr, Heinrich et al.; "Digital Communication Receivers: Synchronization, Channel Estimation, and Signal Processing"; 1998, John Wiley & Sons, Inc.; pp. 212-213 and 217-218; XP002364874.

Meyr, Heinrich et al.; "Digital Communication Receivers: Synchronization, Channel Estimation, and Signal Processing"; 1998, John Wiley & Sons, Inc.; pp. 610-612; XP002364876.

Fant, T. et al.; "Fourth-Power Law Clock Recovery with Prefiltering"; Proceedings of the International Conference on Communications (ICC); Geneva; May 23-26, 1993; New York; IEEE; US; vol. 3; May 23, 1993; pp. 811-815 XP010137089, ISBN: 0-7803-0950-2; Section I, Introduction.

Patent Abstracts of Japan; vol. 015, No. 355 (E-1109): JP 03139027; Nippon Telegraph and Telephone Corporation; Publication date: Jun. 13, 1991.

Wolcott, Ted J. et al.; "Uplink-Noise Limited Satellite Channels"; IEEE 1995; pp. 717-721; XP-00580915.

Seskar, Ivan et al.; "Implementation Aspects for Successive Interface Cancellation in DS/CDMA Systems"; Wireless Networks; 1998; pp. 447-452.

Earth Station Technology; 1986; pp. 404-412; XP-002248387.

Chen, Ernest et al.; "DVB-S2 Backward-Compatible Modes: A Bridge Between the Present and the Future"; International Journal of Satellite Communications and Networking; vol. 22, Issue 3, pp. 341-365; published 2004 by John Wiley & Sons, Ltd.

\* cited by examiner

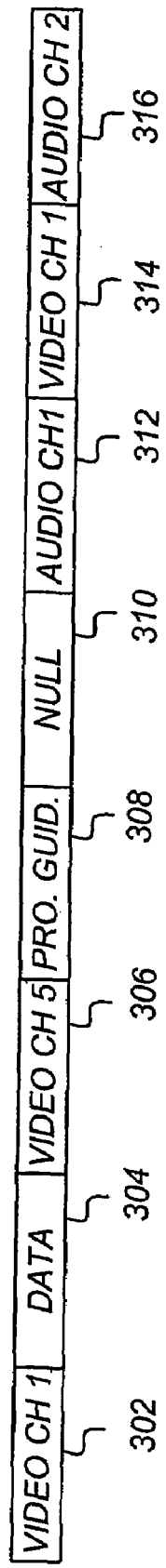
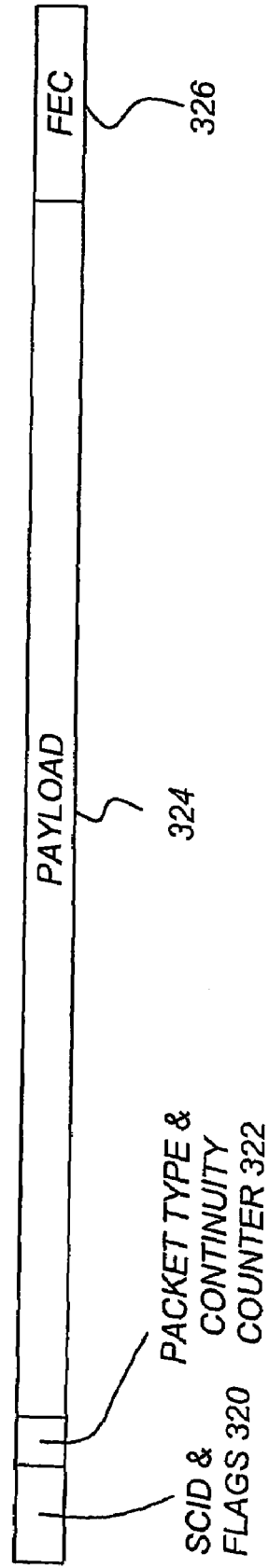

ESTIMATING THE OPERATING POINT ON A NON-LINEAR TRAVELING WAVE TUBE AMPLIFIER

CROSS-REFERENCE TO RELATED APPLICATIONS

This application claims the benefit under 35 U.S.C. §119 (e) of the following U.S. Provisional Patent Applications, which are incorporated by reference herein:

U.S. Provisional Patent Application No. 60/421,289, filed Oct. 25, 2002 by Ernest C. Chen and Shamik Maitra, entitled "ESTIMATING THE OPERATING POINT ON A NON-LINEAR TRAVELING WAVE TUBE AMPLIFIER"; and U.S. Provisional Patent Application No. 60/510,368, filed on Oct. 10, 2003, by Ernest C. Chen, entitled "IMPROVING TWTA AM-AM AND AM-PM MEASUREMENT".

This is a continuation-in-part application and claims the benefit under 35 U.S.C. §120 of the following co-pending and commonly-assigned U.S. utility patent applications, which are incorporated by reference herein:

Utility application Ser. No. 09/844,401, filed Apr. 27, 2001, by Ernest C. Chen, entitled "LAYERED MODULATION FOR DIGITAL SIGNALS;" and U.S. application Ser. No. 10/165,710, filed on Jun. 7, 2002, by Ernest C. Chen, entitled "SATELLITE TWTA ON-LINE NON-LINEARITY MEASUREMENT."

BACKGROUND OF THE INVENTION

1. Field of the Invention

The present invention relates to systems and methods for transmitting data, and in particular to a system and method for estimating a traveling wave tube amplifier operating point to accurately reproduce transmitted signals.

2. Description of the Related Art

Digital signal communication systems have been used in various fields, including digital TV signal transmission, either terrestrial or satellite. As the various digital signal communication systems and services evolve, there is a burgeoning demand for increased data throughput and added services. However, it is more difficult to implement either improvement in old systems or new services when it is necessary to replace existing legacy hardware, such as transmitters and receivers. New systems and services are advantaged when they can utilize existing legacy hardware. In the realm of wireless communications, this principle is further highlighted by the limited availability of electromagnetic spectrum. Thus, it is not possible (or at least not practical) to merely transmit enhanced or additional data at a new frequency.

The conventional method of increasing spectral capacity is to move to a higher-order modulation, such as from quadrature phase shift keying (QPSK) to eight phase shift keying (8PSK) or sixteen quadrature amplitude modulation (16QAM). Unfortunately, QPSK receivers cannot demodulate conventional 8PSK or 16QAM signals. As a result, legacy customers with QPSK receivers must upgrade their receivers in order to continue to receive any signals transmitted with an 8PSK or 16QAM modulation.

It is advantageous for systems and methods of transmitting signals to accommodate enhanced and increased data throughput without requiring additional frequency. In addition, it is advantageous for enhanced and increased throughput signals for new receivers to be backwards compatible with legacy receivers. There is further an advantage for systems and methods which allow transmission signals to be upgraded from a source separate from the legacy transmitter.

It has been proposed that a layered modulation signal, transmitting non-coherently both upper and lower layer signals, can be employed to meet these needs. Such layered modulation systems allow higher information throughput with backwards compatibility. However, even when backward compatibility is not required (such as with an entirely new system), layered modulation can still be advantageous because it requires a traveling wave tube amplifier (TWTA) peak power significantly lower than that for a conventional 8PSK or 16QAM modulation format for a given throughput.

To provide a layered modulation scheme (as described in detail below), a reconstructed upper layer signal is subtracted from a received composite signal to reveal a lower layer signal. As such, the lower-layer signal performance is impacted by how closely the upper-layer signal can be reconstructed relative to the original signal. In other words, the lower layer signal performance is impacted by the fidelity of the reconstructed signal. Thus, layered modulation requires clean cancellation of the upper-layer signal to expose the lower-layer signal for further processing. Clean cancellation requires TWTA non-linearity/distortion to be accurately reproduced in the reconstruction of the upper-layer signal. Accurate reproduction of TWTA non-linearity in turn requires knowledge about the TWTA operating point. However, such an accurate reproduction and knowledge of the operating point presents a significant roadblock.

With a TWTA, there is a region of approximate linearity, in which the output power is nearly proportional to the input power, followed by a curved transition to a point where the output power levels off and reaches a maximum. At this point (i.e., when the TWTA curve becomes non-linear), the amplifier is said to have reached saturation. Due to this non-linearity and to avoid intermodulation, the input power is often "backed off" by a particular amount (e.g., 6 dB). The resulting point on the curve after the input power is "backed off" is referred to as the operating point of the TWTA. When subsequently reconstructing the upper layer signal, the amount of distortion/non-linearity used to create the original signal serves to increase the fidelity of the reconstructed signal. Thus, to produce a high fidelity reconstructed upper layer signal, knowledge of the non-linearity as well as the operating point is useful. Accordingly, the inclusion of (or taking into account) TWTA non-linearity (and operating point) may improve upper-layer signal cancellation ratio by 10 dB or more (i.e., the ratio between non-linearity-induced noise before and after cancellation is improved).

Errors in the estimation of the operating point can have a significant impact when reconstructing the upper layer-signal. The impact of amplitude (AM-AM [amplitude modulation to amplitude modulation]) and phase (AM-PM [amplitude modulation to phase modulation]) operating point errors may be individually analyzed based on shift analysis. Individual impacts may then be combined for total impact. To evaluate performance impacts, the synthesis of a layer-modulated signal with known TWTA non-linearity and system/representative operating CNR (carrier to noise ratio) may be used. The upper-layer cancellation error may then be calculated for each amount of simulated operating point error in the signal reconstruction process. Thus, the upper layer cancellation ratio may be plotted against the operating point displacement. The cancellation error can then be converted into an amount of lower-layer CNR degradation, which increases the CNR required for signals of both upper and lower layers. Such an increased CNR illustrates the significance of operating point estimation errors.

FIGS. 16A and 16B illustrate the impact of operating point errors in signal reconstruction. In FIGS. 16A and 16B, the sensitivity of signal reconstruction error is plotted against the TWTA input operating point error. The effective noise is calculated as a measure of signal reconstruction error.

In FIG. 16A, a set of generic TWTA non-linearity curves are used. The signal reconstruction process is assumed to have full knowledge about the non-linearity curves but is otherwise uncertain about the operating point. The performance plots of FIG. 16A indicate that cancellation errors are below −25 dB for an input operating point error up to about +/−1 dB.

In FIG. 16B, the performance plots are based on the same TWTA non-linearity but with an input backoff of 8 dB. With such an input backoff, there is improved linearity, that is less susceptible to TWTA operating point error. As a result, reconstruction and cancellation errors are greatly reduced as indicated in FIG. 16B. The effective noise is below −33 dB with an input operating error up to about +/−1 dB.

Accordingly, there is a need for systems and methods for implementing layered modulation systems that accurately determine TWTA non-linearity and the operating point.

In the prior art, the TWTA operating point is obtained from telemetry tracking and control (TT&C) commands that set the operating point of the TWTA (assuming that TWTA characteristics have little changed since the satellite was launched). In other words, the operating point set by TT&C commands during pre-launch measurements is used post-launch after receiving the signals from the satellite. However, TWTA characteristics including the non-linearity and operating point may change over time (including after satellite launch).

Accordingly, what is needed is a system and method for accurately determining the non-linearity and operating point of a TWTA as it changes over time. The present invention meets this need and provides further advantages as detailed hereafter.

SUMMARY OF THE INVENTION

To address the requirements described above, the present invention discloses a method and apparatus for measuring and applying the non-linearity of a traveling wave tube amplifier, such as in satellite communications involving layered modulation. estimating the operating point on a non-linear traveling wave tube amplifier (TWTA). In this regard, the invention aids in the accurate extraction of a lower-layer signal in a layered modulation scheme. Such an accurate extraction minimizes the amounts of power required for both layers of a signal and also helps to monitor the health of a TWTA.

To measure/apply the non-linearity of the TWTA, the operating points (input and/or output) for the TWTA are also determined. Initially, the non-linearity of the TWTA is measured (e.g., using a measuring module). For example, the TWTA non-linearity may be measured at a local receiver, or at a broadcast center (in which case, the non-linearity is downloaded to a local receiver [e.g., for layered modulation and other applications]). As part of such a non-linearity measurement, various input and output values/points are processed to create the non-linearity curve. An input root-mean-square (RMS) value of the input signals used to measure the non-linearity is computed. The RMS value identifies an input operating point of the measured non-linearity of the TWTA. In addition, an output operating point may also be obtained (e.g., by a measuring module). The output operating point may be based on an RMS value of the various output values/points used in measuring the TWTA non-linearity. Alternatively, the output operating point may simply be based on the corresponding point (to the input RMS value) on the TWTA non-linearity curve.

Once the non-linearity has been measured and operating points obtained/computed, an upper layer signal (as part of the layered modulation scheme) may be reconstructed (e.g., by the receiver). Such a reconstruction is more accurate since the appropriate levels of distortion accountable to the TWTA non-linearity are accounted for. In addition, the measured non-linearity may be offset to simplify the reconstruction of the upper signal. Such an offsetting may provide for scaling an input amplitude value and output amplitude value of the measured non-linearity to place the output operating point at a desired point. Such a scaling may be conducted by subtracting a measured input operating point value from all input values in a log domain. Accordingly, the scaling may also be conducted by subtracting a measured output operating point value from all operating values in the log domain. The scaling may also be conducted by subtracting a measured phase value at the output operating point from phase values of all output points used to measure the non-linearity of the TWTA.

In addition to the above, when offsetting the measured non-linearity, certain data may fall outside of the measured non-linearity. To account for such data, bounding points may be placed beyond the end points (that are used to measure the non-linearity). Such bounding points may then be used to interpolate data. Further, the input operating point and output operating point may also be mapped to a particular level to avoid fractional overflow.

BRIEF DESCRIPTION OF THE DRAWINGS

Referring now to the drawings in which like reference numbers represent corresponding parts throughout:

FIG. 3A is a diagram of a representative data stream;

FIG. 3B is a diagram of a representative data packet;

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

1. Overview

The invention provides a method of determining/estimating the operating point of a TWTA. The operating point is estimated at the same time TWTA non-linearity is measured. Therefore, no extra measurement procedures are required for the determination of the operating point, and the measured non-linearity is always up-to-date, allowing the measurement to follow any changes in TWTA characteristics over time.

2. Video Distribution System

Figure 1:
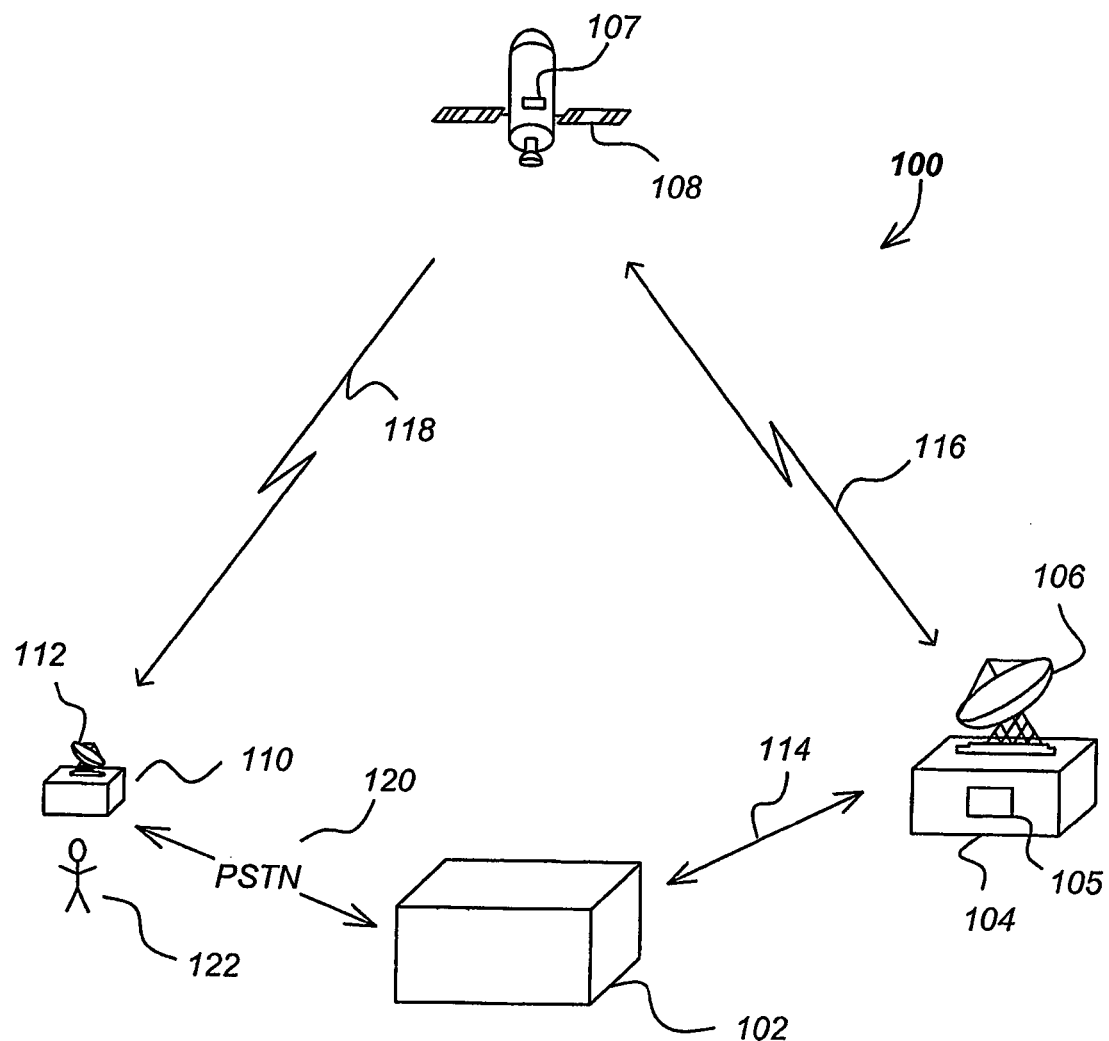
FIG. 1 is a diagram illustrating an overview of a single satellite video distribution system.

FIG. 1 is a diagram illustrating an overview of a single satellite video distribution system 100. The video distribution system 100 comprises a control center 102 in communication with an uplink center 104 via a ground or other link 114 and with a subscriber receiver station 110 via a public switched telephone network PSTN or other link 120. The control center 102 provides program material (e.g. video programs, audio programs and data) to the uplink center 104 and coordinates with the subscriber receiver stations 110 to offer, for example, pay-per-view (PPV) program services, including billing and associated decryption of video programs.

The uplink center 104 receives program material and program control information from the control center 102, and using an uplink antenna 106 and transmitter 105, transmits the program material and program control information to the satellite 108 via uplink signal 116. The satellite receives and processes this information, and transmits the video programs and control information to the subscriber receiver station 110 via downlink signal 118 using transmitter 107. The subscriber receiving station 110 receives this information using the outdoor unit (ODU) 112, which includes a subscriber antenna and a low noise block converter (LNB).

In one embodiment, the subscriber receiving station antenna is an 18-inch slightly oval-shaped Ku-band antenna. The slight oval shape is due to the 22.5 degree offset feed of the LNB (low noise block converter) which is used to receive signals reflected from the subscriber antenna. The offset feed positions the LNB out of the way so it does not block any surface area of the antenna minimizing attenuation of the incoming microwave signal.

The video distribution system 100 can comprise a plurality of satellites 108 in order to provide wider terrestrial coverage, to provide additional channels, or to provide additional bandwidth per channel. In one embodiment of the invention, each satellite comprises 16 transponders to receive and transmit program material and other control data from the uplink center 104 and provide it to the subscriber receiving stations 110. Using data compression and multiplexing techniques the channel capabilities, two satellites 108 working together can receive and broadcast over 150 conventional (non-HDTV) audio and video channels via 32 transponders.

While the invention disclosed herein will be described with reference to a satellite-based video distribution system 100, the present invention may also be practiced with terrestrial-based transmission of program information, whether by broadcasting means, cable, or other means. Further, the different functions collectively allocated among the control center 102 and the uplink center 104 as described above can be reallocated as desired without departing from the intended scope of the present invention.

Although the foregoing has been described with respect to an embodiment in which the program material delivered to the subscriber 122 is video (and audio) program material such as a movie, the foregoing method can be used to deliver program material comprising purely audio information or other data as well.

2.1 Uplink Configuration

Figure 2:
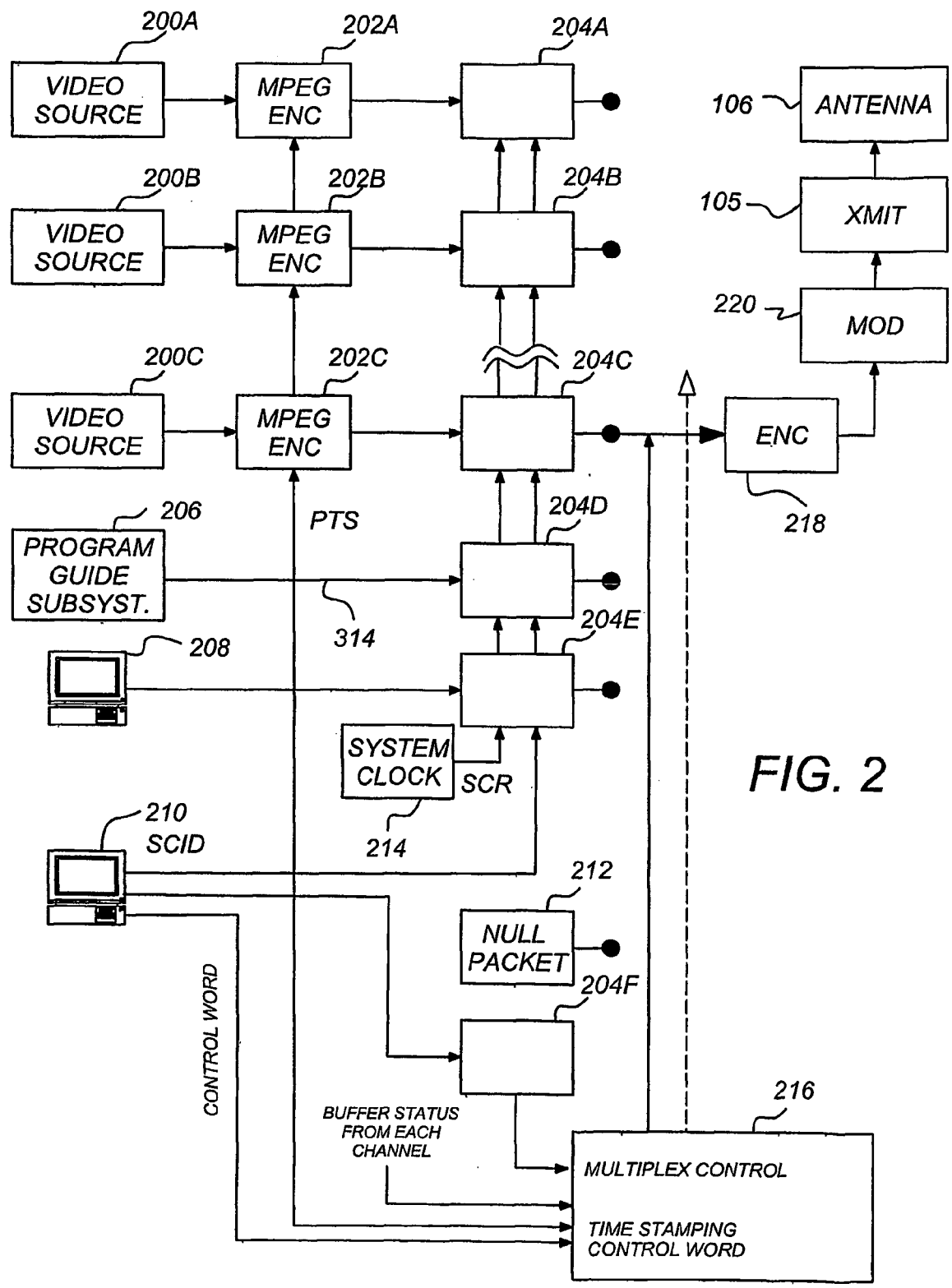
FIG. 2 is a block diagram showing a typical uplink configuration for a single satellite transponder.

FIG. 2 is a block diagram showing a typical uplink configuration for a single satellite 108 transponder, showing how video program material is uplinked to the satellite 108 by the control center 102 and the uplink center 104. FIG. 2 shows three video channels (which may be augmented respectively with one or more audio channels for high fidelity music, soundtrack information, or a secondary audio program for transmitting foreign languages), a data channel from a program guide subsystem 206 and computer data information from a computer data source 208.

The video channels are provided by a program source 200A–200C of video material (collectively referred to hereinafter as program source(s) 200). The data from each program source 200 is provided to an encoder 202A–202C (collectively referred to hereinafter as encoder(s) 202). Each of the encoders accepts a program time stamp (PTS) from the controller 216. The PTS is a wrap-around binary time stamp that is used to assure that the video information is properly synchronized with the audio information after encoding and decoding. A PTS time stamp is sent with each I-frame of the MPEG encoded data.

In one embodiment of the present invention, each encoder 202 is a second generation Motion Picture Experts Group (MPEG-2) encoder, but other decoders implementing other coding techniques can be used as well. The data channel can be subjected to a similar compression scheme by an encoder (not shown), but such compression is usually either unnecessary, or performed by computer programs in the computer data source (for example, photographic data is typically compressed into *.TIF files or *.JPG files before transmission). After encoding by the encoders 202, the signals are converted into data packets by a packetizer 204A–204F (collectively referred to hereinafter as packetizer(s) 204) associated with each program source 200.

The data packets are assembled using a reference from the system clock 214 (SCR), and from the conditional access manager 210, which provides the service channel identifier (SCID) to the packetizers 204 for use in generating the data packets. These data packets are then multiplexed into serial data and transmitted.

2.2 Broadcast Data Stream Format and Protocol

FIG. 3A is a diagram of a representative data stream. The first packet segment 302 comprises information from video channel 1 (data coming from, for example, the first video program source 200A). The next packet segment 304 comprises computer data information that was obtained, for example from the computer data source 208. The next packet segment 306 comprises information from video channel 5 (from one of the video program sources 200). The next packet segment 308 comprises program guide information such as the information provided by the program guide subsystem 206. As shown in FIG. 3A, null packets 310 created by the null packet module 212 may be inserted into the data stream as desired followed by further data packets 312, 314, 316 from the program sources 200.

The data stream therefore comprises a series of packets (302–316) from any one of the data sources (e.g. program sources 200, program guide subsystem 206, computer data source 208) in an order determined by the controller 216. The data stream is encrypted by the encryption module 218, modulated by the modulator 220 (typically using a QPSK modulation scheme), and provided to the transmitter 105/222, which broadcasts the modulated data stream on a frequency bandwidth to the satellite via the antenna 106. The receiver 500 at the receiver station 110 receives these signals, and using the SCID, reassembles the packets to regenerate the program material for each of the channels.

FIG. 3B is a diagram of a data packet. Each data packet (e.g. 302–316) is 147 bytes long, and comprises a number of packet segments. The first packet segment 320 comprises two bytes of information containing the SCID and flags. The SCID is a unique 12-bit number that uniquely identifies the data packet's data channel. The flags include 4 bits that are used to control other features. The second packet segment 322 is made up of a 4-bit packet type indicator and a 4-bit continuity counter. The packet type identifies the packet as one of the four data types (video, audio, data, or null). When combined with the SCID, the packet type determines how the data packet will be used. The continuity counter increments once for each packet type and SCID. The next packet segment 324 comprises 127 bytes of payload data, which in the cases of packets 302 or 306 is a portion of the video program provided by the video program source 200. The final packet segment 326 is data required to perform forward error correction.

Figure 4:
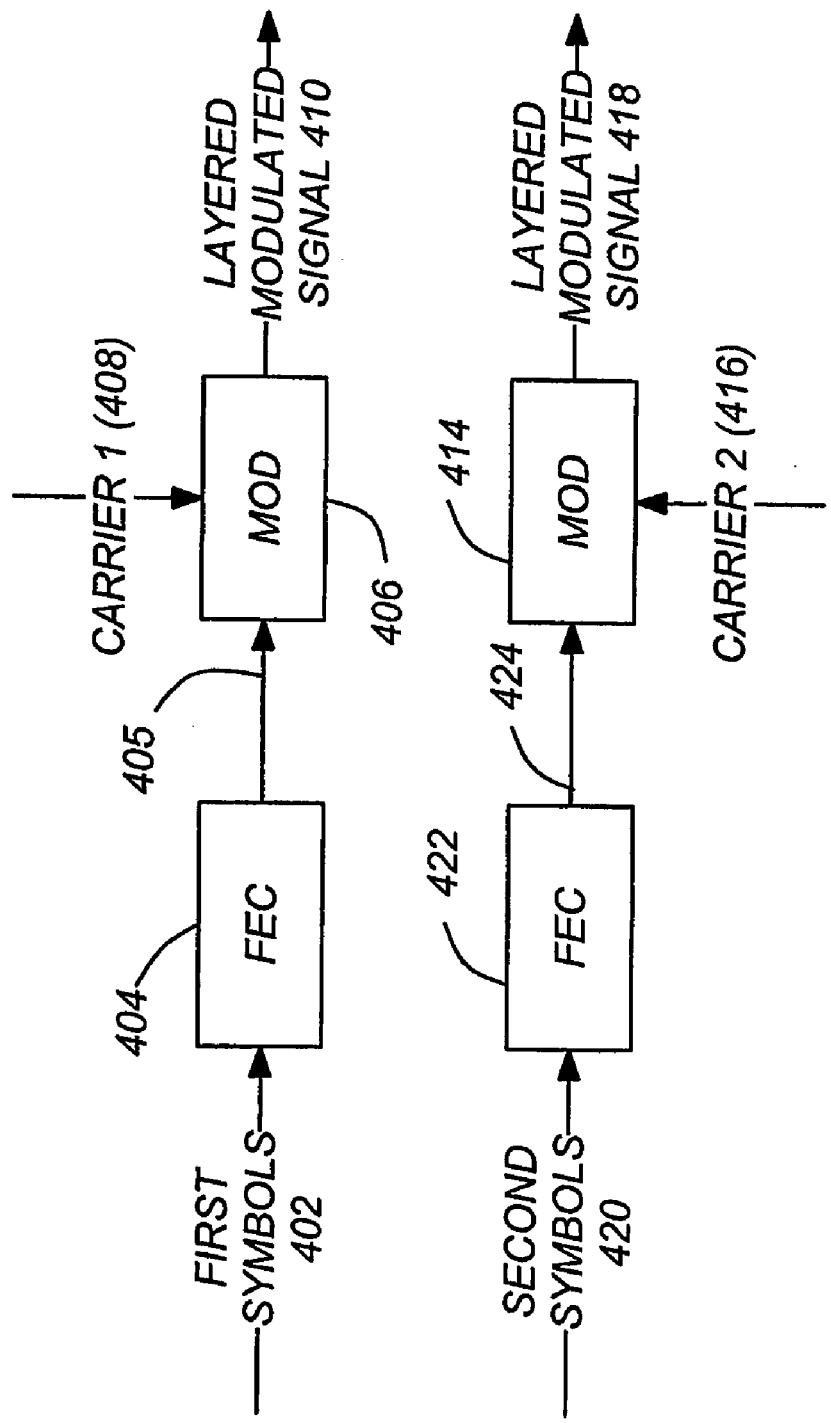
FIG. 4 is a block diagram showing one embodiment of the modulator for the uplink signal.

FIG. 4 is a block diagram showing one embodiment of the modulator 220. The modulator 220 optionally comprises a forward error correction (FEC) encoder 404 which accepts the first signal symbols 402 and adds redundant information that are used to reduce transmission errors. The coded symbols 405 are modulated by modulator 406 according to a first carrier 408 to produce an upper layer modulated signal 410. Second symbols 420 are likewise provided to an optional second FEC encoder 422 to produce coded second symbols 424. The coded second symbols 424 are provided to a second modulator 414, which modulates the coded second symbols 424 according to a second carrier 416 to produce a lower layer modulated signal 418. The upper layer modulated signal 410 and the lower layer modulated signal 418 are therefore uncorrelated. Thus, the upper layer signal 410 and the lower layer signal 418 can be transmitted to separate transponders on one or more satellites 108 via separate uplink signals 116. Thus, the lower layer signal 418 can be implemented from a separate satellite 108 that receives a separate uplink signal 116. However, in the downlink signal 118 the upper layer signal 410, must be a sufficiently greater amplitude signal than the lower layer signal 418, to maintain the signal constellations shown in FIG. 6 and FIG. 7.

It should be noted that it may be more efficient to retrofit an existing system by using a transponder on a separate satellite 108 to transmit the lower layer downlink signal over the existing legacy downlink signal rather than replacing the legacy satellite with one that will transmit both downlink signal layers. Emphasis can be given to accommodating the downlink legacy signal in implementing a layered downlink broadcast.

2.3 Integrated Receiver/Decoder

Figure 5:
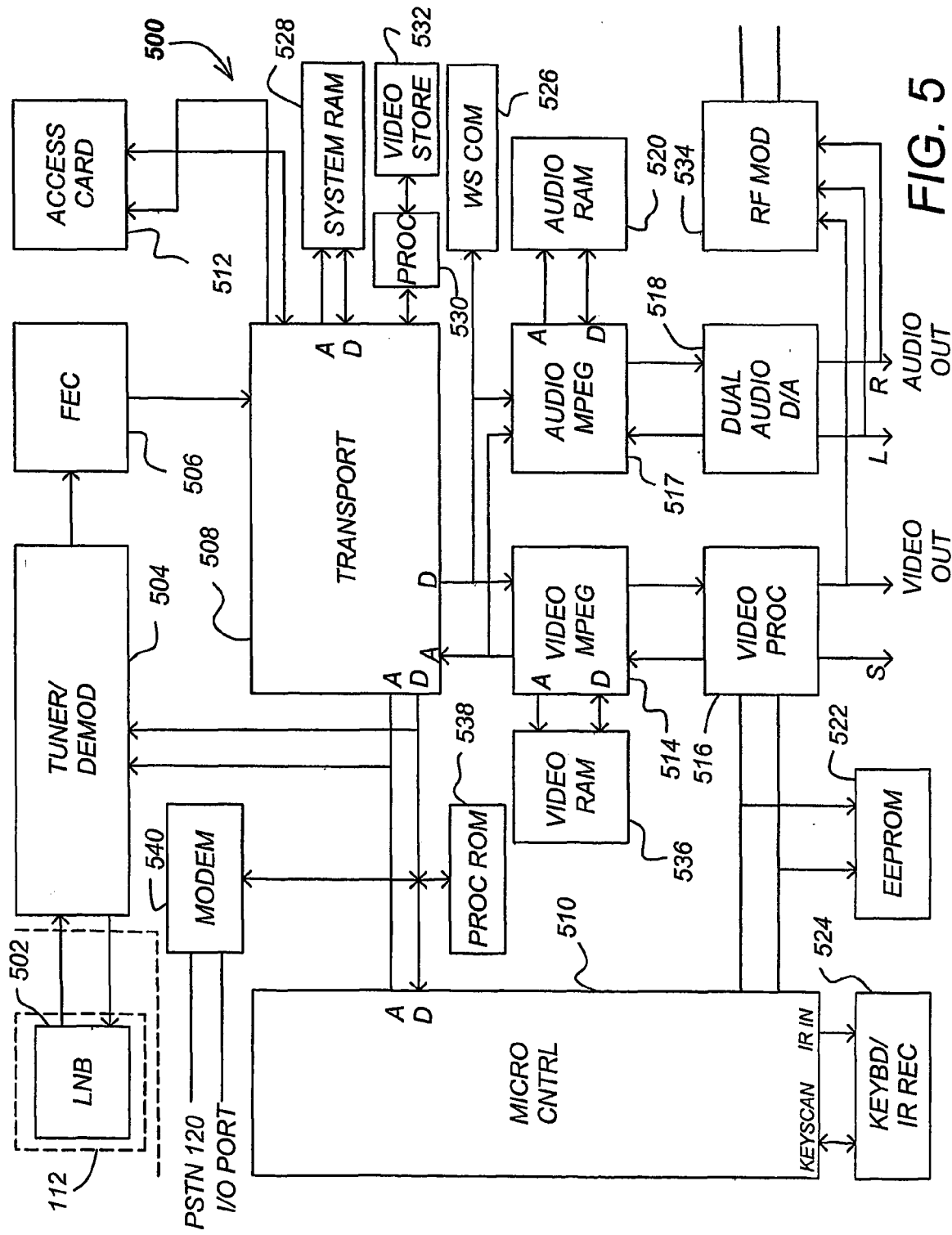
FIG. 5 is a block diagram of an integrated receiver/decoder.

FIG. 5 is a block diagram of an integrated receiver/decoder (IRD) 500 (also hereinafter alternatively referred to as receiver 500). The receiver 500 comprises a tuner/demodulator 504 communicatively coupled to an ODU 112 having one or more low noise blocks (LNBs) 502. The LNB 502 converts the 12.2- to 12.7 GHz downlink 118 signal from the satellites 108 to, e.g., a 950–1450 MHz signal required by the IRD's 500 tuner/demodulator 504. Typically, the LNB 502 may provide either a dual or a single output. The single-output LNB 502 has only one RF connector, while the dual output LNB 502 has two RF output connectors and can be used to feed a second tuner 504, a second receiver 500, or some other form of distribution system.

The tuner/demodulator 504 isolates a single, digitally modulated 24 MHz transponder signal, and converts the modulated data to a digital data stream. Further details regarding the demodulation of the received signal follow.

The digital data stream is then supplied to a forward error correction (FEC) decoder 506. This allows the IRD 500 to reassemble the data transmitted by the uplink center 104 (which applied the forward error correction to the desired signal before transmission to the subscriber receiving station 110) verifying that the correct data signal was received, and correcting errors, if any. The error-corrected data may be fed from the FEC decoder module 506 to the transport module 508 via an 8-bit parallel interface.

The transport module 508 performs many of the data processing functions performed by the IRD 500. The transport module 508 processes data received from the FEC decoder module 506 and provides the processed data to the video MPEG decoder 514 and the audio MPEG decoder 517. As needed the transport module employs system RAM 528 to process the data. In one embodiment of the present invention, the transport module 508, video MPEG decoder 514 and audio MPEG decoder 517 are all implemented on integrated circuits. This design promotes both space and power efficiency, and increases the security of the functions performed within the transport module 508. The transport module 508 also provides a passage for communications between the microcontroller 510 and the video and audio MPEG decoders 514, 517. As set forth more fully hereinafter, the transport module also works with the conditional access module (CAM) 512 to determine whether the subscriber receiving station 110 is permitted to access certain program material. Data from the transport module 508 can also be supplied to external communication module 526.

The CAM 512 functions in association with other elements to decode an encrypted signal from the transport module 508. The CAM 512 may also be used for tracking and billing these services. In one embodiment of the present invention, the CAM 512 is a removable smart card, having contacts cooperatively interacting with contacts in the IRD 500 to pass information. In order to implement the processing performed in the CAM 512, the IRD 500, and specifically the transport module 508 provides a clock signal to the CAM 512.

Video data is processed by the MPEG video decoder 514. Using the video random access memory (RAM) 536, the MPEG video decoder 514 decodes the compressed video data and sends it to an encoder or video processor 516, which converts the digital video information received from the video MPEG module 514 into an output signal usable by a display or other output device. By way of example, processor 516 may comprise a National TV Standards Committee (NTSC) or Advanced Television Systems Committee (ATSC) encoder. In one embodiment of the invention both S-Video and ordinary video (NTSC or ATSC) signals are provided. Other outputs may also be utilized, and are advantageous if high definition programming is processed.

Audio data is likewise decoded by the MPEG audio decoder 517. The decoded audio data may then be sent to a digital to analog (D/A) converter 518. In one embodiment of the present invention, the D/A converter 518 is a dual D/A converter, one for the right and left channels. If desired, additional channels can be added for use in surround sound processing or secondary audio programs (SAPs). In one embodiment of the invention, the dual D/A converter 518 itself separates the left and right channel information, as well as any additional channel information. Other audio formats may similarly be supported. For example, other audio formats such as multi-channel DOLBY DIGITAL AC-3 may be supported.

A description of the processes performed in the encoding and decoding of video streams, particularly with respect to MPEG and JPEG encoding/decoding, can be found in Chapter 8 of "Digital Television Fundamentals," by Michael Robin and Michel Poulin, McGraw-Hill, 1998, which is hereby incorporated by reference herein.

The microcontroller 510 receives and processes command signals from the remote control 524, an IRD 500 keyboard interface, and/or another input device. The microcontroller 510 receives commands for performing its operations from a processor programming memory, which permanently stores such instructions for performing such commands. The processor programming memory may comprise a read only memory (ROM) 538, an electrically erasable programmable read only memory (EPROM) 522 or, similar memory device. The microcontroller 510 also controls the other digital devices of the IRD 500 via address and data lines (denoted "A" and "D" respectively, in FIG. 5).

The modem 540 connects to the customer's phone line via the PSTN port 120. It calls, e.g. the program provider, and transmits the customer's purchase information for billing purposes, and/or other information. The modem 540 is controlled by the microprocessor 510. The modem 540 can output data to other I/O port types including standard parallel and serial computer I/O ports.

The present invention also comprises a local storage unit such as the video storage device 532 for storing video and/or audio data obtained from the transport module 508. Video storage device 532 can be a hard disk drive, a read/writable compact disc of DVD, a solid state RAM, or any other suitable storage medium. In one embodiment of the present invention, the video storage device 532 is a hard disk drive with specialized parallel read/write capability so that data may be read from the video storage device 532 and written to the device 532 at the same time. To accomplish this feat, additional buffer memory accessible by the video storage 532 or its controller may be used. Optionally, a video storage processor 530 can be used to manage the storage and retrieval of the video data from the video storage device 532. The video storage processor 530 may also comprise memory for buffering data passing into and out of the video storage device 532. Alternatively or in combination with the foregoing, a plurality of video storage devices 532 can be used. Also alternatively or in combination with the foregoing, the microcontroller 510 can also perform the operations required to store and or retrieve video and other data in the video storage device 532.

The video processing module 516 input can be directly supplied as a video output to a viewing device such as a video or computer monitor. In addition, the video and/or audio outputs can be supplied to an RF modulator 534 to produce an RF output and/or 8 vestigal side band (VSB) suitable as an input signal to a conventional television tuner. This allows the receiver 500 to operate with televisions without a video output.

Each of the satellites 108 comprises a transponder, which accepts program information from the uplink center 104, and relays this information to the subscriber receiving station 110. Known multiplexing techniques are used so that multiple channels can be provided to the user. These multiplexing techniques include, by way of example, various statistical or other time domain multiplexing techniques and polarization multiplexing. In one embodiment of the invention, a single transponder operating at a single frequency band carries a plurality of channels identified by respective service channel identification (SCID).

Preferably, the IRD 500 also receives and stores a program guide in a memory available to the microcontroller 510. Typically, the program guide is received in one or more data packets in the data stream from the satellite 108. The program guide can be accessed and searched by the execution of suitable operation steps implemented by the microcontroller 510 and stored in the processor ROM 538. The program guide may include data to map viewer channel numbers to satellite transponders and service channel identifications (SCIDs), and also provide TV program listing information to the subscriber 122 identifying program events.

The functionality implemented in the IRD 500 depicted in FIG. 5 can be implemented by one or more hardware modules, one or more software modules defining instructions performed by a processor, or a combination of both.

The present invention provides for the modulation of signals at different power levels and advantageously for the signals to be non-coherent from each layer. In addition, independent modulation and coding of the signals may be performed. Backwards compatibility with legacy receivers, such as a quadrature phase shift keying (QPSK) receiver is enabled and new services are provided to new receivers. A typical new receiver of the present invention uses two demodulators and one remodulator as will be described in detail hereafter.

In a typical backwards-compatible embodiment of the present invention, the legacy QPSK signal is boosted in power to a higher transmission (and reception) level. This creates a power "room" in which a new lower layer signal may operate. The legacy receiver will not be able to distinguish the new lower layer signal, from additive white Gaussian noise, and thus operates in the usual manner. The optimum selection of the layer power levels is based on accommodating the legacy equipment, as well as the desired new throughput and services.

The new lower layer signal is provided with a sufficient carrier to thermal noise ratio to function properly. The new lower layer signal and the boosted legacy signal are non-coherent with respect to each other. Therefore, the new lower layer signal can be implemented from a different TWTA and even from a different satellite. The new lower layer signal format is also independent of the legacy format, e.g., it may be QPSK or 8PSK, using the conventional concatenated FEC code or using a new Turbo code. The lower layer signal may even be an analog signal.

The combined layered signal is demodulated and decoded by first demodulating the upper layer to remove the upper carrier. The stabilized layered signal may then have the upper layer FEC decoded and the output upper layer symbols communicated to the upper layer transport. The upper layer symbols are also employed in a remodulator, to generate an idealized upper layer signal. The idealized upper layer signal is then subtracted from the stable layered signal to reveal the lower layer signal. The lower layer signal is then demodulated and FEC decoded and communicated to the lower layer transport.

Signals, systems and methods using the present invention may be used to supplement a pre-existing transmission compatible with legacy receiving hardware in a backwards-compatible application or as part of a preplanned layered modulation architecture providing one or more additional layers at a present or at a later date.

2.4 Layered Signals

Figure 6B:
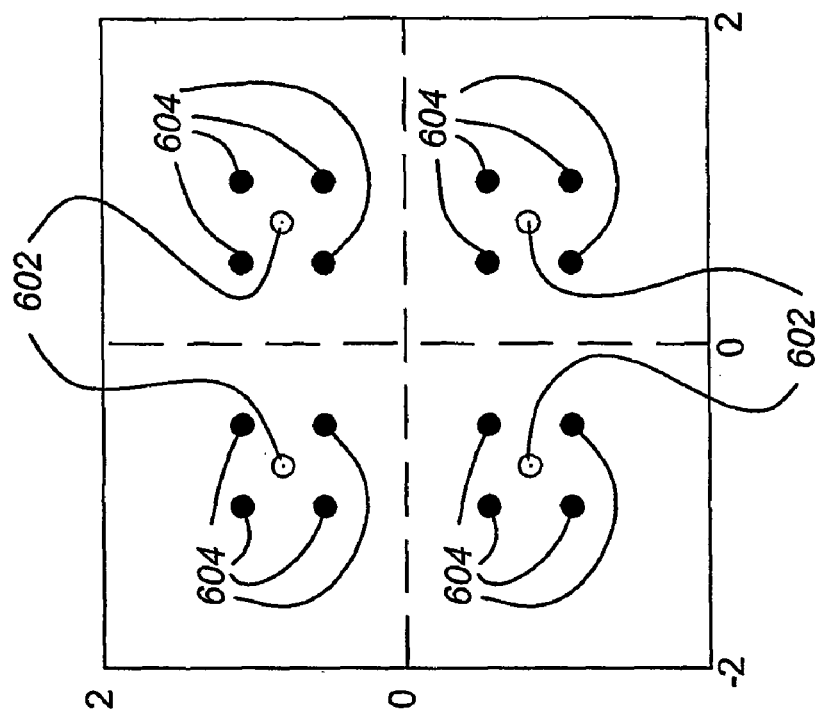
FIGS. 6A–6C are diagrams illustrating the basic relationship of signal layers in a layered modulation transmission.
Figure 6A:
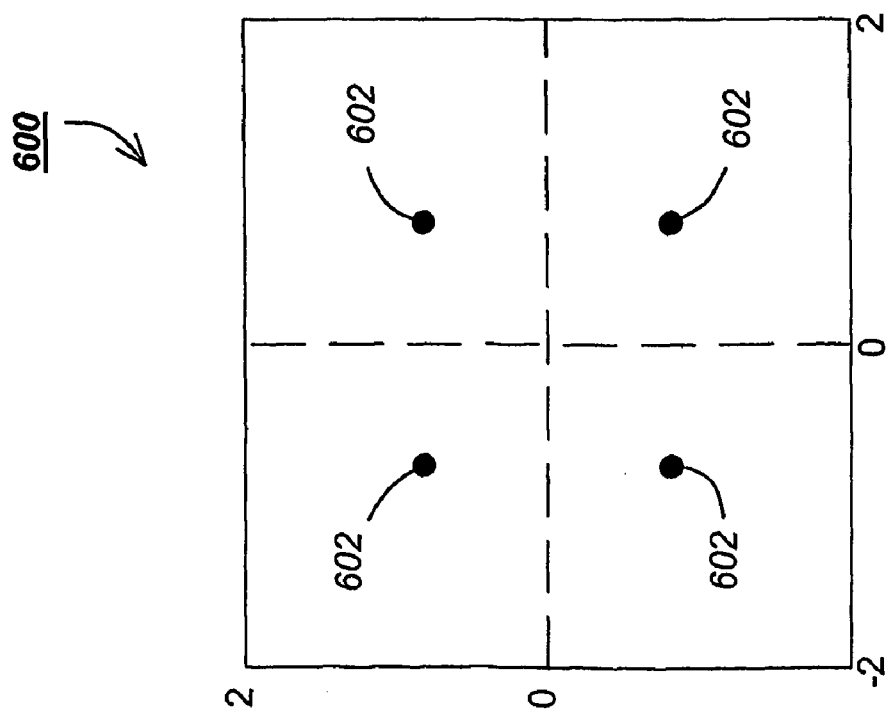
Figure 6C:
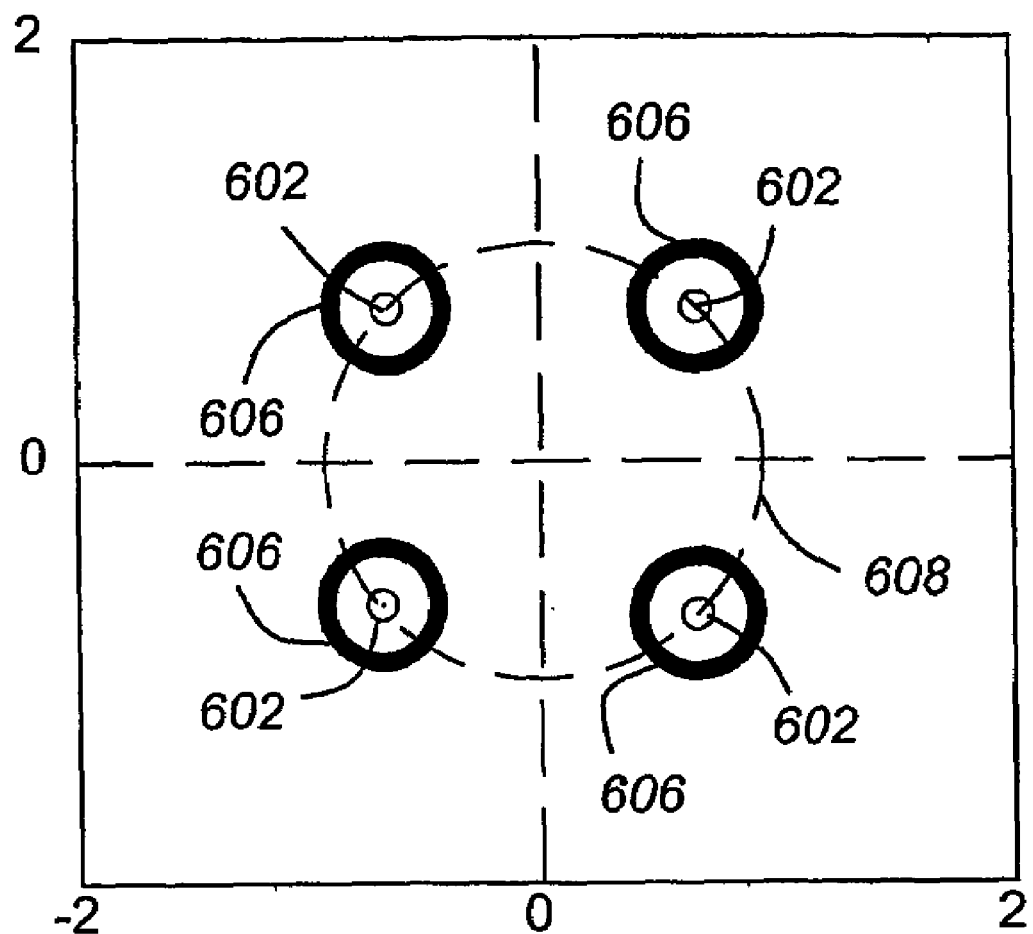

FIGS. 6A–6C illustrate the basic relationship of signal layers in a received layered modulation transmission. FIG. 6A illustrates an upper layer signal constellation 600 of a transmission signal showing the signal points or symbols 602. FIG. 6B illustrates the lower layer signal constellation of symbols 604 over the upper layer signal constellation 600 where the layers are coherent (or synchronized). FIG. 6C illustrates a lower layer signal 606 of a second transmission layer over the upper layer constellation where the layers are non-coherent. The lower layer 606 rotates about the upper layer constellation 602 due to the relative modulating frequencies of the two layers in a non-coherent transmission. Both the upper and lower layers rotate about the origin due to the first layer modulation frequency as described by path 608.

Figure 7B:
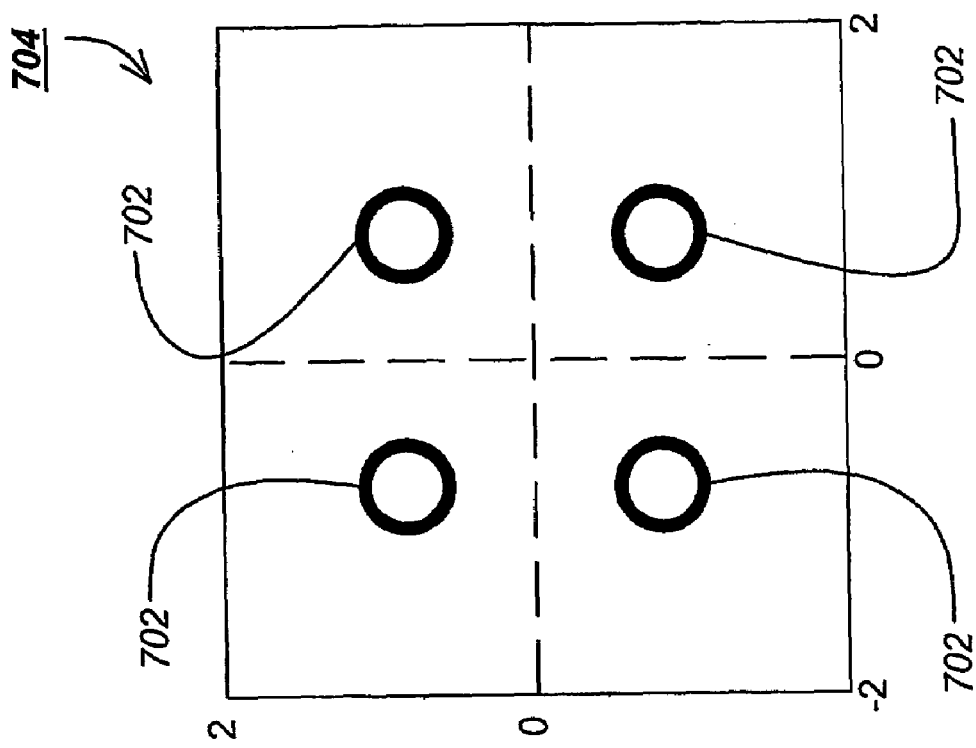
FIGS. 7A–7C are diagrams illustrating a signal constellation of a second transmission layer over the first transmission layer after first layer demodulation.
Figure 7A:
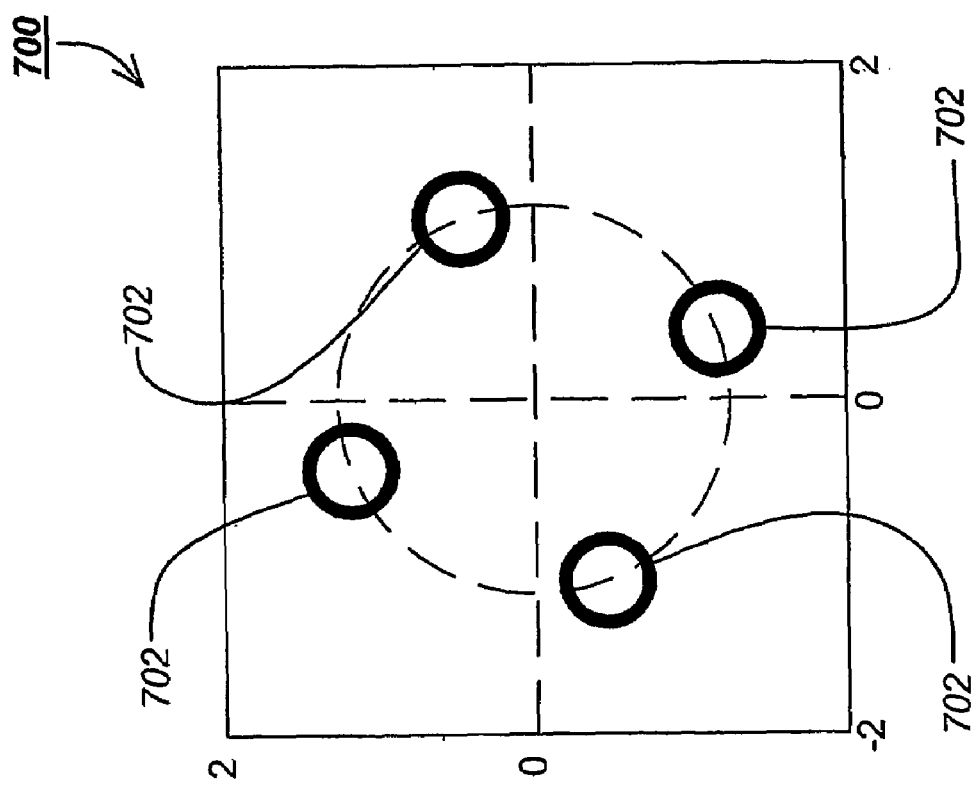
Figure 7C:
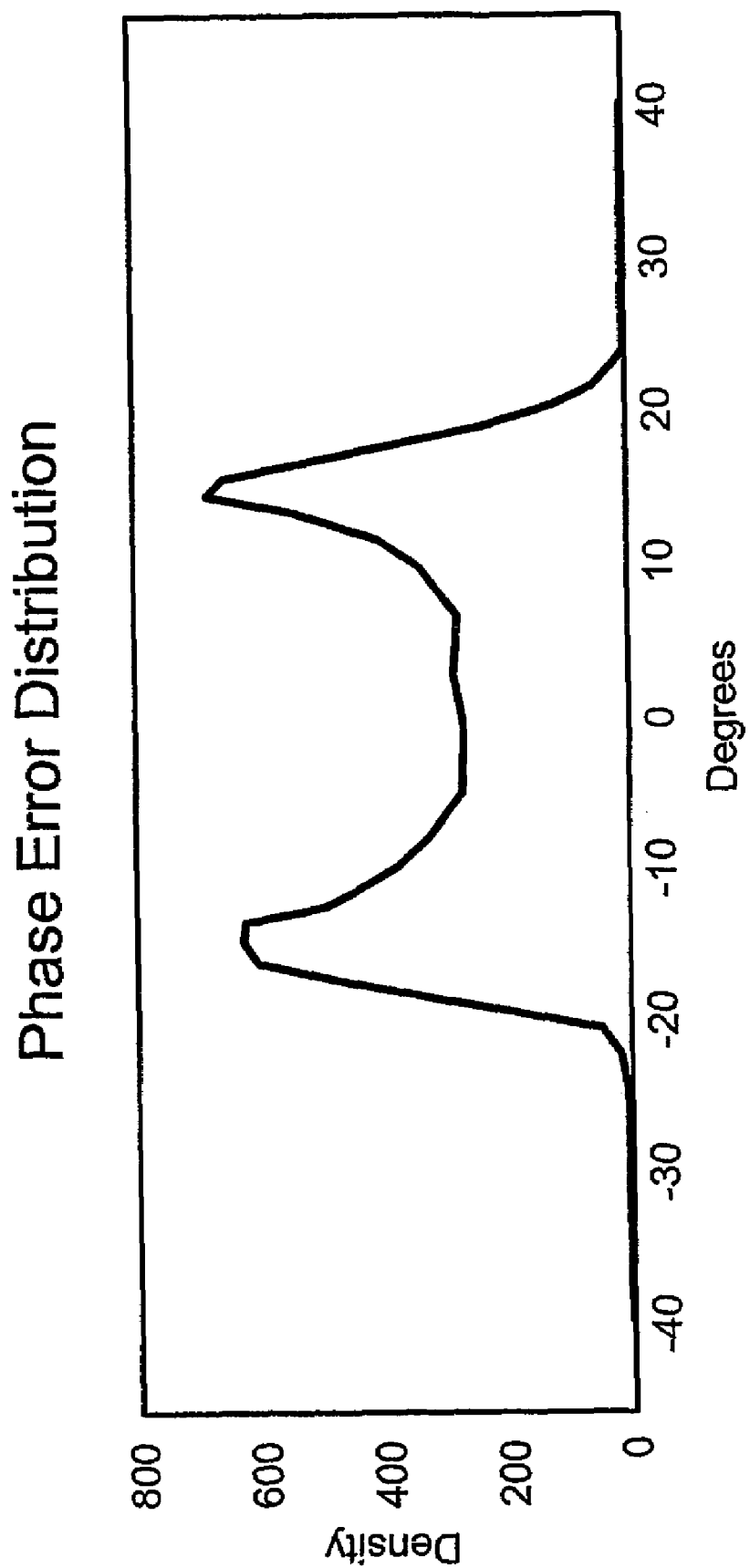

FIGS. 7A–7C are diagrams illustrating a non-coherent relationship between a lower transmission layer over the upper transmission layer after upper layer demodulation. FIG. 7A shows the constellation 700 before the first carrier recovery loop (CRL) of the upper layer and the constellation rings 702 rotate around the large radius circle indicated by the dashed line. FIG. 7B shows the constellation 704 after CRL of the upper layer where the rotation of the constellation rings 702 is stopped. The constellation rings 702 are the signal points of the lower layer around the nodes 602 of the upper layer. FIG. 7C depicts a phase distribution of the received signal with respect to nodes 602.

Relative modulating frequencies of the non-coherent upper and lower layer signals cause the lower layer constellation to rotate around the nodes 602 of the upper layer constellation to form rings 702. After the lower layer CRL this rotation is eliminated and the nodes of the lower layer are revealed (as shown in FIG. 6B). The radius of the lower layer constellation rings 702 is indicative of the lower layer power level. The thickness of the rings 702 is indicative of the carrier to noise ratio (CNR) of the lower layer. As the two layers are non-coherent, the lower layer may be used to transmit distinct digital or analog signals.

Figure 8A:
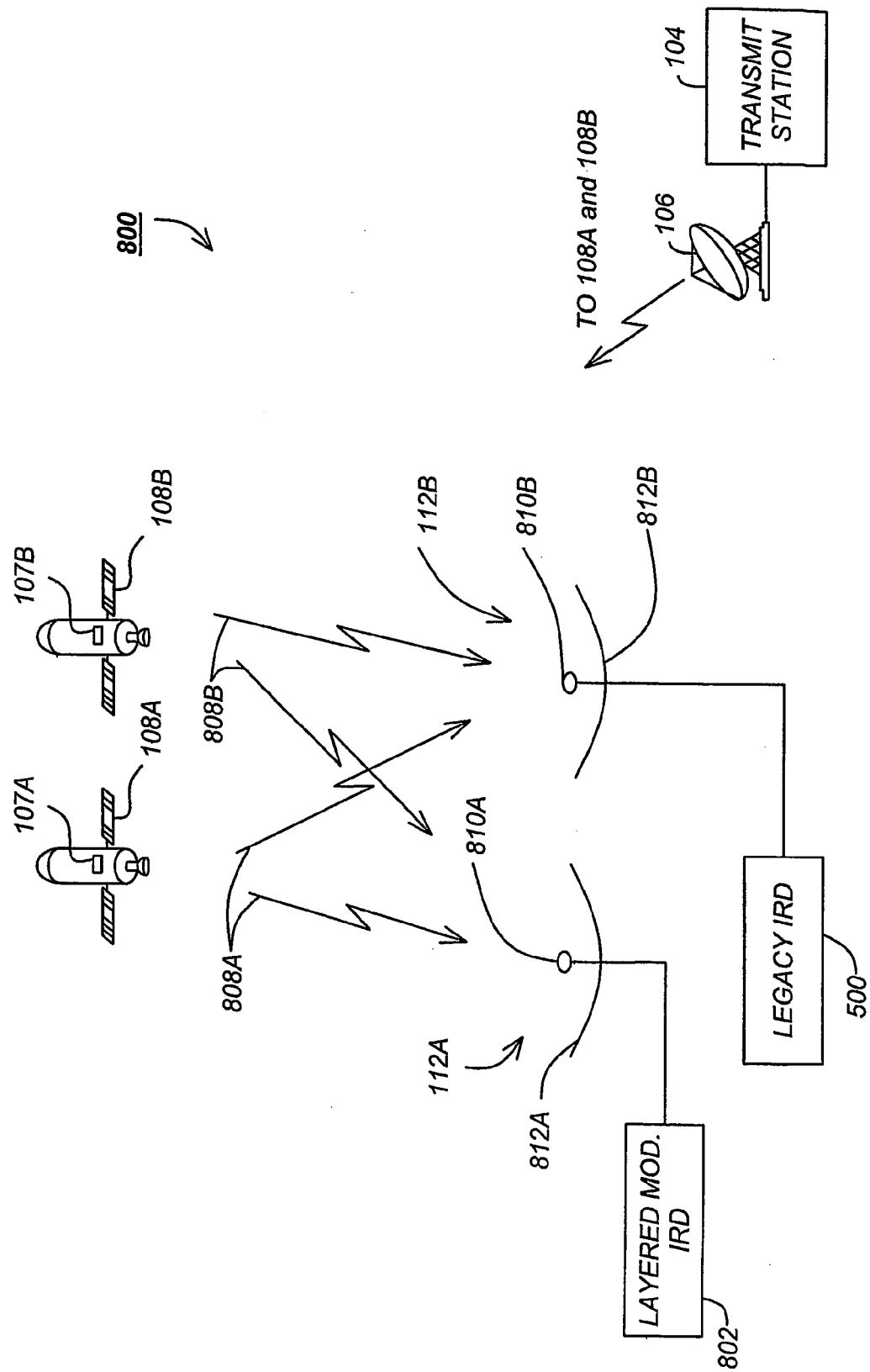
FIG. 8A is a diagram showing a system for transmitting and receiving layered modulation signals.

FIG. 8A is a diagram showing a system for transmitting and receiving layered modulation signals. Separate transmitters 107A, 107B (that include TWTAs to amplify the signals), as may be located on any suitable platform, such as satellites 108A, 108B, are used to non-coherently transmit different layers of a signal of the present invention. Uplink signals 116 are typically transmitted to each satellite 108A, 108B from one or more uplink centers 104 with one or more transmitters 105 via an antenna 106.

Figure 8B:
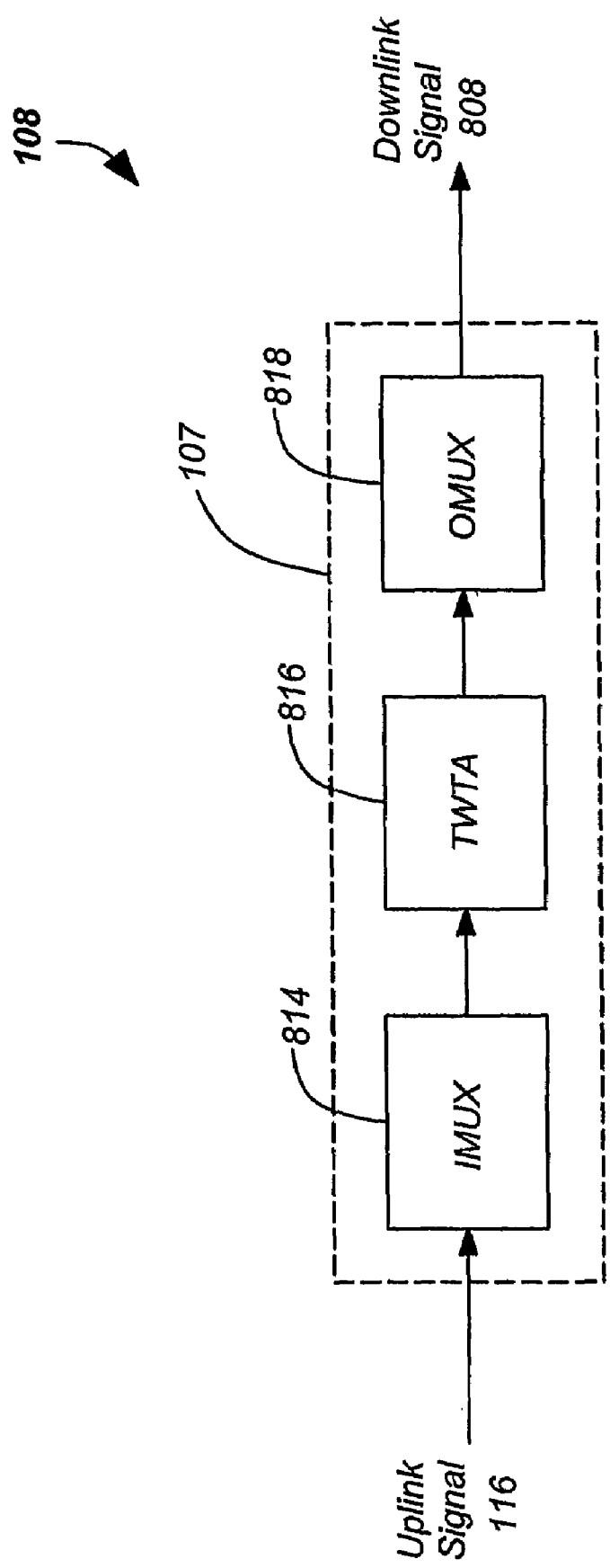
FIG. 8B is a diagram showing an exemplary satellite transponder for receiving and transmitting layered modulation signals.

FIG. 8B is a diagram illustrating an exemplary satellite transponder 107 for receiving and transmitting layered modulation signals on a satellite 108. The uplink signal 116 is received by the satellite 108 and passed through a input multiplexer (IMUX) 814. Following this the signal is amplified with a travelling wave tube amplifier (TWTA) 816 and then through an output muliplexer (OMUX) 818 before the downlink signal 118 is transmitted to the receivers 802, 500.

The layered signals 808A, 808B (e.g. multiple downlink signals 118) are received at receiver antennas 812A, 812B, such as satellite dishes, each with a low noise block (LNB) 810A, 8101B where they are then coupled to integrated receiver/decoders (IRDs) 500, 802. For example, first satellite 108A and transmitter 107A can transmit an upper layer legacy signal 808A and second satellite 108B and transmitter 107B can transmit a lower layer signal 808B. Although both signals 808A, 808B arrive at each antenna 812A, 812B and LNB 810A, 810B, only the layer modulation IRD 802 is capable of decoding both signals 808A, 808B. The legacy receiver 500 is only capable of decoding the upper layer legacy signal 808A; the lower layer signal 808B appears only as noise to the legacy receiver 500.

Because the signal layers may be transmitted non-coherently, separate transmission layers may be added at any time using different satellites 108A, 108B or other suitable platforms, such as ground based or high altitude platforms. Thus, any composite signal, including new additional signal layers will be backwards compatible with legacy receivers 500, which will disregard the new signal layers. To ensure that the signals do not interfere, the combined signal and noise level for the lower layer must be at or below the allowed noise floor for the upper layer at the particular receiver antenna 812A, 812B.

Layered modulation applications include backwards compatible and non-backwards compatible applications. "Backwards compatible" in this sense, describes systems in which legacy receivers 500 are not rendered obsolete by the additional signal layer(s). Instead, even if the legacy receivers 500 are incapable of decoding the additional signal layer(s), they are capable of receiving the layered modulated signal and decoding the original signal layer. In these applications, the pre-existing system architecture is accommodated by the architecture of the additional signal layers. "Non-backwards compatible" describes a system architecture which makes use of layered modulation, but the modulation scheme employed is such that pre-existing equipment is incapable of receiving and decoding the information on additional signal layer(s).

The pre-existing legacy IRDs 500 decode and make use of data only from the layer (or layers) they were designed to receive, unaffected by the additional layers. However, as will be described hereafter, the legacy signals may be modified to optimally implement the new layers. The present invention may be applied to existing direct satellite services which are broadcast to individual users in order to enable additional features and services with new receivers without adversely affecting legacy receivers and without requiring additional signal frequency.

2.5 Demodulator and Decoder

Figure 9:
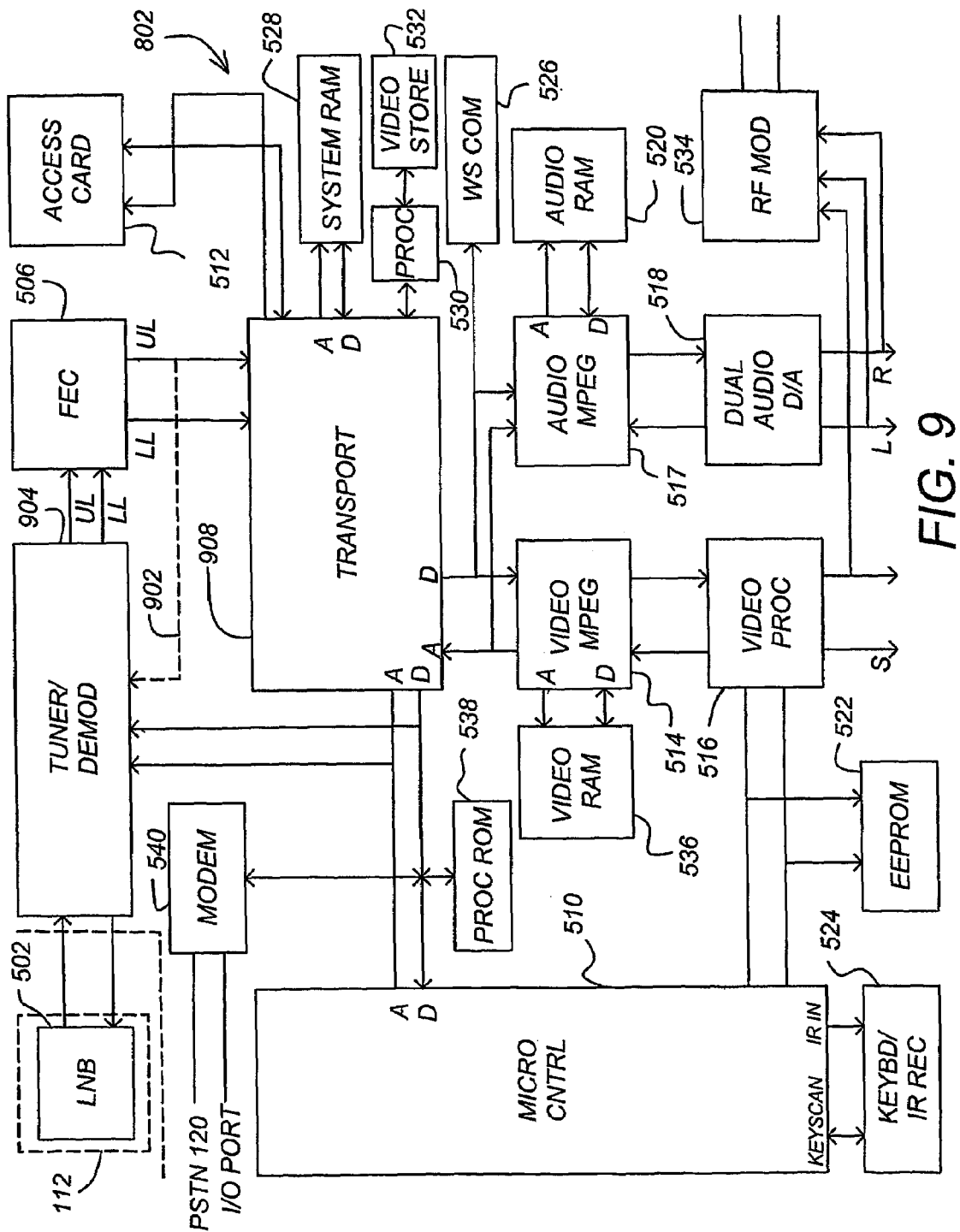
FIG. 9 is a block diagram depicting one embodiment of an enhanced IRD capable of receiving layered modulation signals.

FIG. 9 is a block diagram depicting one embodiment of an enhanced IRD 802 capable of receiving layered modulation signals. The enhanced IRD 802 includes a feedback path 902 in which the FEC decoded symbols are fed back to a enhanced modified tuner/demodulator 904 and transport module 908 for decoding both signal layers as detailed hereafter.

Figure 10A:
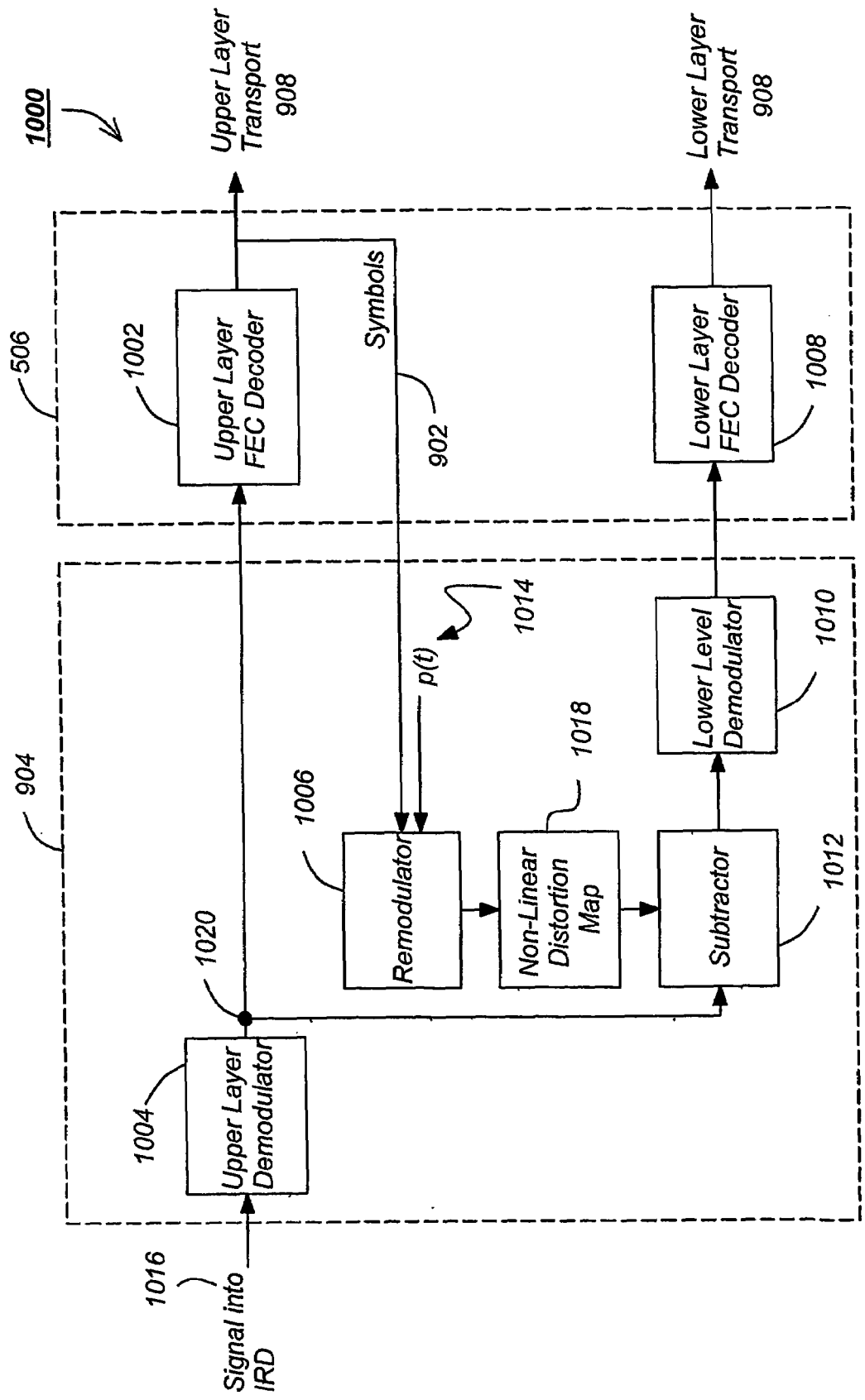
FIG. 10A is a block diagram of one embodiment of the enhanced tuner/modulator and FEC encoder.

FIG. 10A is a block diagram of one embodiment of the enhanced tuner/modulator 904 and FEC encoder 506. FIG. 10A depicts reception where layer subtraction is performed on a signal where the upper layer carrier has already been demodulated. The upper layer of the received combined signal 1016 from the LNB 502, which may contain legacy modulation format, is provided to and processed by an upper layer demodulator 1004 to produce the stable demodulated signal 1020. The demodulated signal 1010 is communicatively coupled to a FEC decoder 1002 which decodes the upper layer to produce the upper layer symbols which are output to an upper layer transport module 908. The upper layer symbols are also used to generate an idealized upper layer signal. The upper layer symbols may be produced from the decoder 402 after Viterbi decode (BER<$10^{-3}$ or so) or after Reed-Solomon (RS) decode (BER<$10^{-9}$ or so), in typical decoding operations known to those skilled in the art. The upper layer symbols are provided via feedback path 902 from the upper layer decoder 402 to a remodulator 406 which effectively produces an idealized upper layer signal. The idealized upper level signal is subtracted from the demodulated upper layer signal 1020.

In order for the subtraction to yield a clean small lower layer signal, the upper layer signal must be precisely reproduced. The modulated signal may have been distorted, for example, by traveling wave tube amplifier (TWTA) non-linearity or other non-linear or linear distortions in the transmission channel. The distortion effects are estimated from the received signal after the fact or from TWTA characteristics which may be downloaded into the IRD in AM-AM and/or AM-PM maps 1014, used to eliminate the distortion (e.g., using the non-linear distortion map module 1018) (see detailed description below).

A subtractor 1012 then subtracts the idealized upper layer signal from the stable demodulated signal 1020. This leaves the lower-power second layer signal. The subtractor 1012 may include a buffer or delay function to retain the stable demodulated signal 1020 while the idealized upper layer signal is being constructed. The second layer signal is demodulated by the lower level demodulator 1010 and FEC decoded by decoder 1008 according to its signal format to produce the lower layer symbols, which are provided to the transport module 908.

Figure 10B:
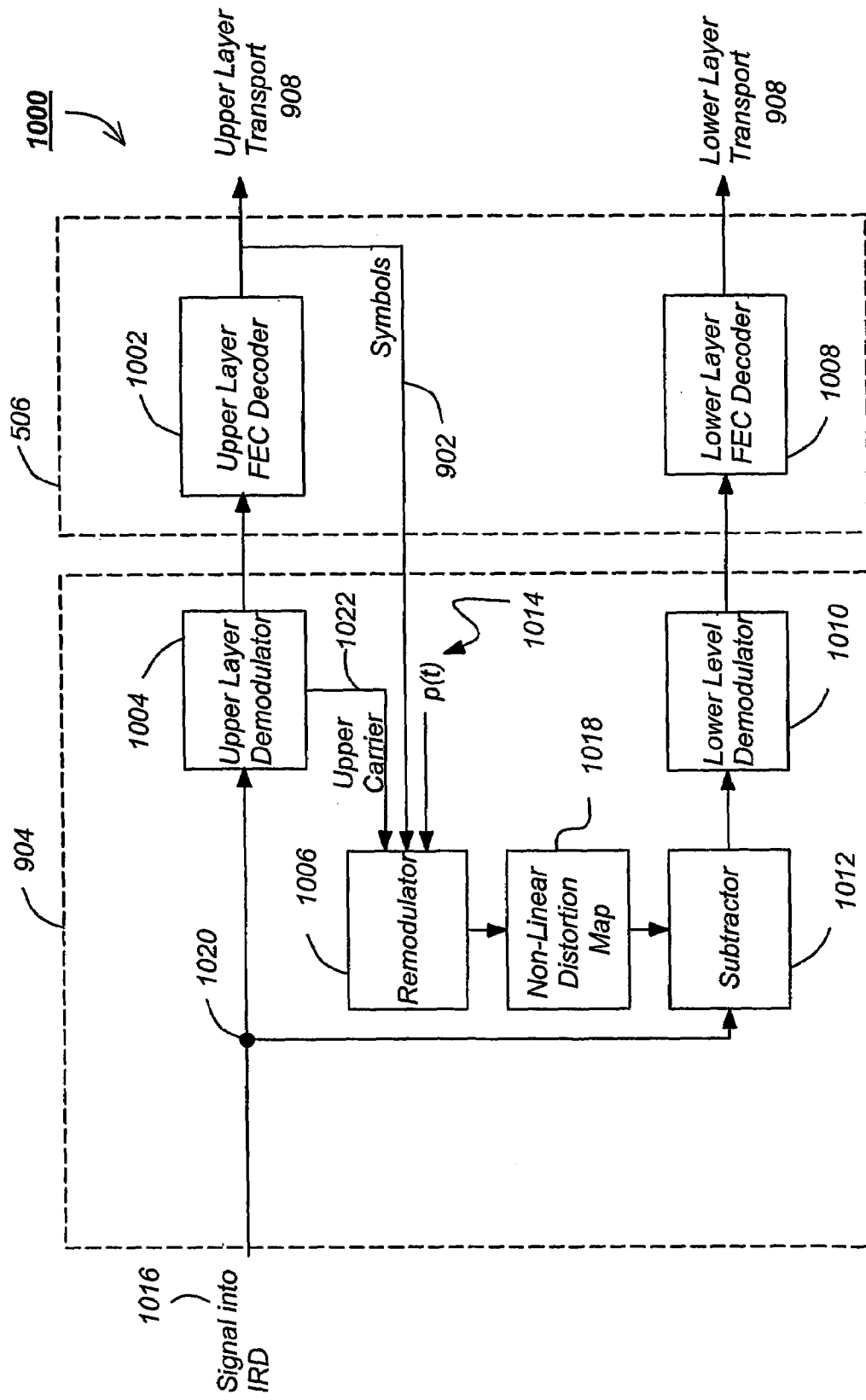
FIG. 10B depicts another embodiment of the enhanced tuner/modulator wherein layer subtraction is performed on the received layered signal.

FIG. 10B depicts another embodiment wherein layer subtraction is performed on the received layered signal (prior to upper layer demodulation). In this case, the upper layer demodulator 1004 produces the upper carrier signal 1022 (as well as the stable demodulated signal output 1020). An upper carrier signal 1022 is provided to the remodulator 1006. The remodulator 1006 provides the remodulated signal to the non-linear distortion mapper 1018 which effectively produces an idealized upper layer signal. Unlike the embodiment shown in FIG. 10A, in this embodiment, the idealized upper layer signal includes the upper layer carrier for subtraction from the received combined signal 808A, 808B.

Other equivalent methods of layer subtraction will occur to those skilled in the art and the present invention should not be limited to the examples provided here. Furthermore, those skilled in the art will understand that the present invention is not limited to two layers; additional layers may be included. Idealized upper layers are produced through remodulation from their respective layer symbols and subtracted. Subtraction may be performed on either the received combined signal or a demodulated signal. Finally, it is not necessary for all signal layers to be digital transmissions; the lowest layer may be an analog transmission.

The following analysis describes the exemplary two layer demodulation and decoding. It will be apparent to those skilled in the art that additional layers may be demodulated and decoded in a similar manner. The incoming combined signal is represented as:

$$s_{UL}(t) = f_U\left(M_U \exp(j\omega_U t + \theta_U) \sum_{m=-\infty}^{\infty} S_{Um} p(t-mT)\right) +$$

$$f_L\left(M_L \exp(j\omega_L t + \theta_L) \sum_{m=-\infty}^{\infty} S_{Lm} p(t-mT+\Delta T_m)\right) + n(t)$$

where, $M_U$ is the magnitude of the upper layer QPSK signal and $M_L$ is the magnitude of the lower layer QPSK signal and $M_L \ll M_U$. The signal frequencies and phase for the upper and lower layer signals are respectively $\omega_U, \theta_U$ and $\omega_L, \theta_L$. The symbol timing misalignment between the upper and lower layers is $\Delta T_m$. p(t-mT) represents the time shifted version of the pulse shaping filter p(t) 414 employed in signal modulation. QPSK symbols $S_{Um}$ and $S_{Lm}$ are elements of $$\left\{\exp\left(j\frac{n\pi}{2}\right), n = 0, 1, 2, 3\right\} \cdot f_U(\cdot)$$

and $f_L(\cdot)$ denote the distortion function of the TWTAs for the respective signals.

Ignoring $f_U(\cdot)$ and $f_L(\cdot)$ and noise n(t), the following represents the combined signal after removing the upper carrier:

$$s'_{UL}(t) = M_U \sum_{m=-\infty}^{\infty} S_{Um} p(t-mT) + M_L \exp$$

$$\{j(\omega_L - \omega_U)t + \theta_L - \theta_U\} \sum_{m=-\infty}^{\infty} S_{Lm} p(t-mT+\Delta T_m)$$

Because of the magnitude difference between $M_U$ and $M_L$, the upper layer demodulator 1004 and decoder 1002 disregard the $M_L$ component of the $s'_{UL}(t)$.

After subtracting the upper layer from $s_{UL}(t)$ in the subtractor 1012, the following remains:

$$s_L(t) = M_L \exp\{j(\omega_L - \omega_U)t + \theta_L - \theta_U\} \sum_{m=-\infty}^{\infty} S_{Lm} p(t - mT + \Delta T_m)$$

Any distortion effects, such as TWTA nonlinearity effects are estimated for signal subtraction. In a typical embodiment of the present invention, the upper and lower layer frequencies are substantially equal. Significant improvements in system efficiency can be obtained by using a frequency offset between layers.

Using the present invention, two-layered backward compatible modulation with QPSK doubles a current 6/7 rate capacity by adding a TWTA approximately 6.2 dB above an existing TWTA power. New QPSK signals may be transmitted from a separate transmitter, from a different satellite for example. In addition, there is no need for linear travelling wave tube amplifiers (TWTAs) as with 16QAM. Also, no phase error penalty is imposed on higher order modulations such as 8PSK and 16QAM.

3.0 Power Levels of Modulation Layers

In a layered modulation system, the relationship between the individual modulation layers can be structured to facilitate backward compatible applications. Alternately, a new layer structure can be designed to optimize the combined efficiency and/or performance of the layered modulation system.

3.1 Backward Compatible Applications

The present invention may be used in Backward Compatible Applications. In such applications, a lower layer signal may take advantage of advanced forward error correction (FEC) coding techniques to lower the overall transmission power required by the system.

Figure 11A:
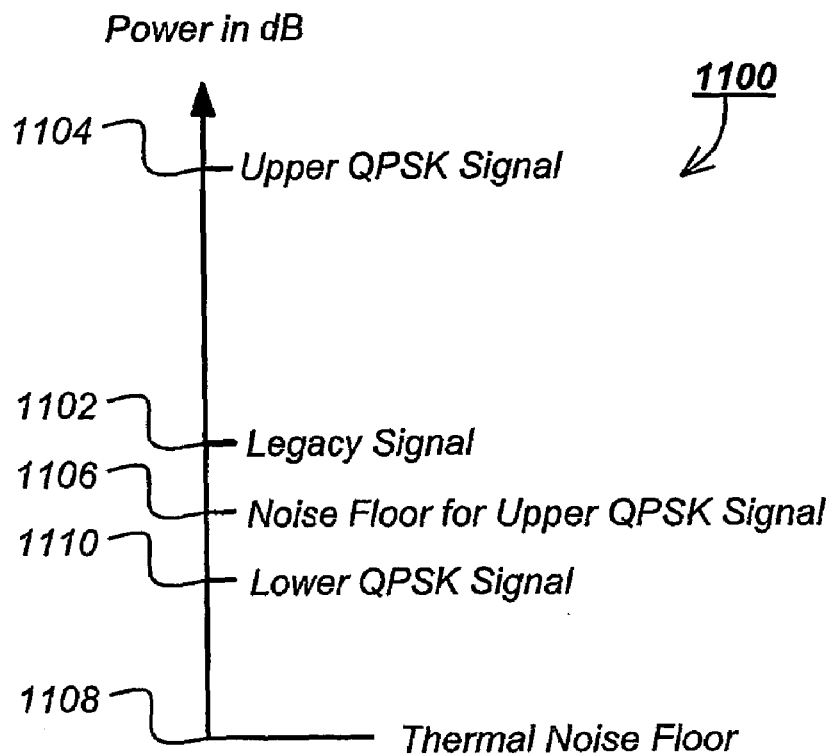
FIGS. 11A and 11B depict the relative power levels of example embodiments of the present invention.

FIG. 11A depicts the relative power levels 1100 of example embodiments of the present invention. FIG. 11A is not a scale drawing. This embodiment doubles the pre-existing rate 6/7 capacity by using a TWTA 6.2 dB above a pre-existing TWTA equivalent isotropic radiated power (ERP) and second TWTA 2 dB below the pre-existing TWTA power. This embodiment uses upper and lower QPSK layers which are non-coherent. A code rate of 6/7 is also used for both layers. In this embodiment, the signal of the legacy QPSK signal 1102 is used to generate the upper layer 1104 and a new QPSK layer is the lower layer 1110. The CNR of the legacy QPSK signal 1102 is approximately 7 dB. In the present invention, the legacy QPSK signal 1102 is boosted in power by approximately 6.2 dB bringing the new power level to approximately 13.2 dB as the upper layer 1104. The noise floor 1106 of the upper layer is approximately 6.2 dB. The new lower QPSK layer 1110 has a CNR of approximately 5 dB. The total signal and noise of the lower layer is kept at or below the tolerable noise floor 1106 of the upper layer. The power boosted upper layer 1104 of the present invention is also very robust, making it resistant to rain fade. It should be noted that the invention may be extended to multiple layers with mixed modulations, coding and code rates.

In an alternate embodiment of this backwards compatible application, a code rate of 2/3 may be used for both the upper and lower layers 1104, 1110. In this case, the CNR of the legacy QPSK signal 1102 (with a code rate of 2/3) is approximately 5.8 dB. The legacy signal 1102 is boosted by approximately 5.3 dB to approximately 11.1 dB (4.1 dB above the legacy QPSK signal 1102 with a code rate of 2/3) to form the upper QPSK layer 1104. The new lower QPSK layer 1110 has a CNR of approximately 3.8 dB. The total signal and noise of the lower layer 1110 is kept at or below approximately 5.3 dB, the tolerable noise floor 1106 of the upper QPSK layer. In this case, overall capacity is improved by 1.55 and the effective rate for legacy IRDs will be 7/9 of that before implementing the layered modulation.

In a further embodiment of a backwards compatible application of the present invention the code rates between the upper and lower layers 1104, 1110 may be mixed. For example, the legacy QPSK signal 502 may be boosted by approximately 5.3 dB to approximately 12.3 dB with the code rate unchanged at 6/7 to create the upper QPSK layer 1104. The new lower QPSK layer 1110 may use a code rate of 2/3 with a CNR of approximately 3.8 dB. In this case, the total capacity relative to the legacy signal 1102 is approximately 1.78. In addition, the legacy IRDs will suffer nosignificant rate decrease.

3.2 Non-Backward Compatible Applications

As previously discussed the present invention may also be used in "non-backward compatible" applications. In such applications, both upper and lower layer signals may take advantage of advanced forward error correction (FEC) coding techniques to lower the overall transmission power required by the system. In a first example embodiment, two QPSK layers 1104, 1110 are used each at a code rate of 2/3. The upper QPSK layer 504 has a CNR of approximately 4.1 dB above its noise floor 1106 and the lower QPSK layer 1110 also has a CNR of approximately 4.1 dB. The total code and noise level of the lower QPSK layer 1110 is approximately 5.5 dB. The total CNR for the upper QPSK signal 1104 is approximately 9.4 dB, merely 2.4 dB above the legacy QPSK signal rate 6/7. The capacity is approximately 1.74 compared to the legacy rate 6/7.

Figure 11B:
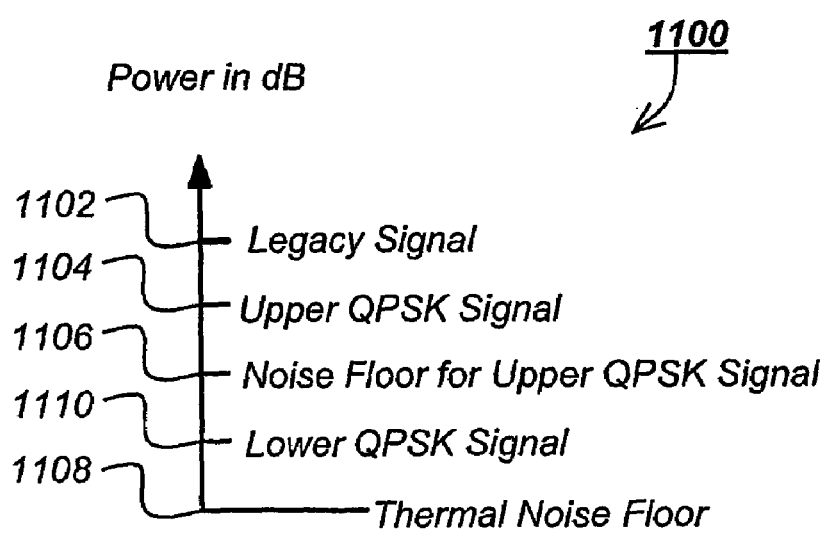

FIG. 11B depicts the relative power levels of an alternate embodiment wherein both the upper and lower layers 1104, 1110 are below the legacy signal level 1102. The two QPSK layers 1104, 1110 use a code rate of ½. In this example, the upper QPSK layer 1104 is approximately 2.0 dB above its noise floor 1106 of approximately 4.1 dB. The lower QPSK layer has a CNR of approximately 2.0 dB and a total code and noise level at or below 4.1 dB. The capacity of this embodiment is approximately 1.31 compared to the legacy rate 6/7.

4. Hardware Environment

Figure 12:
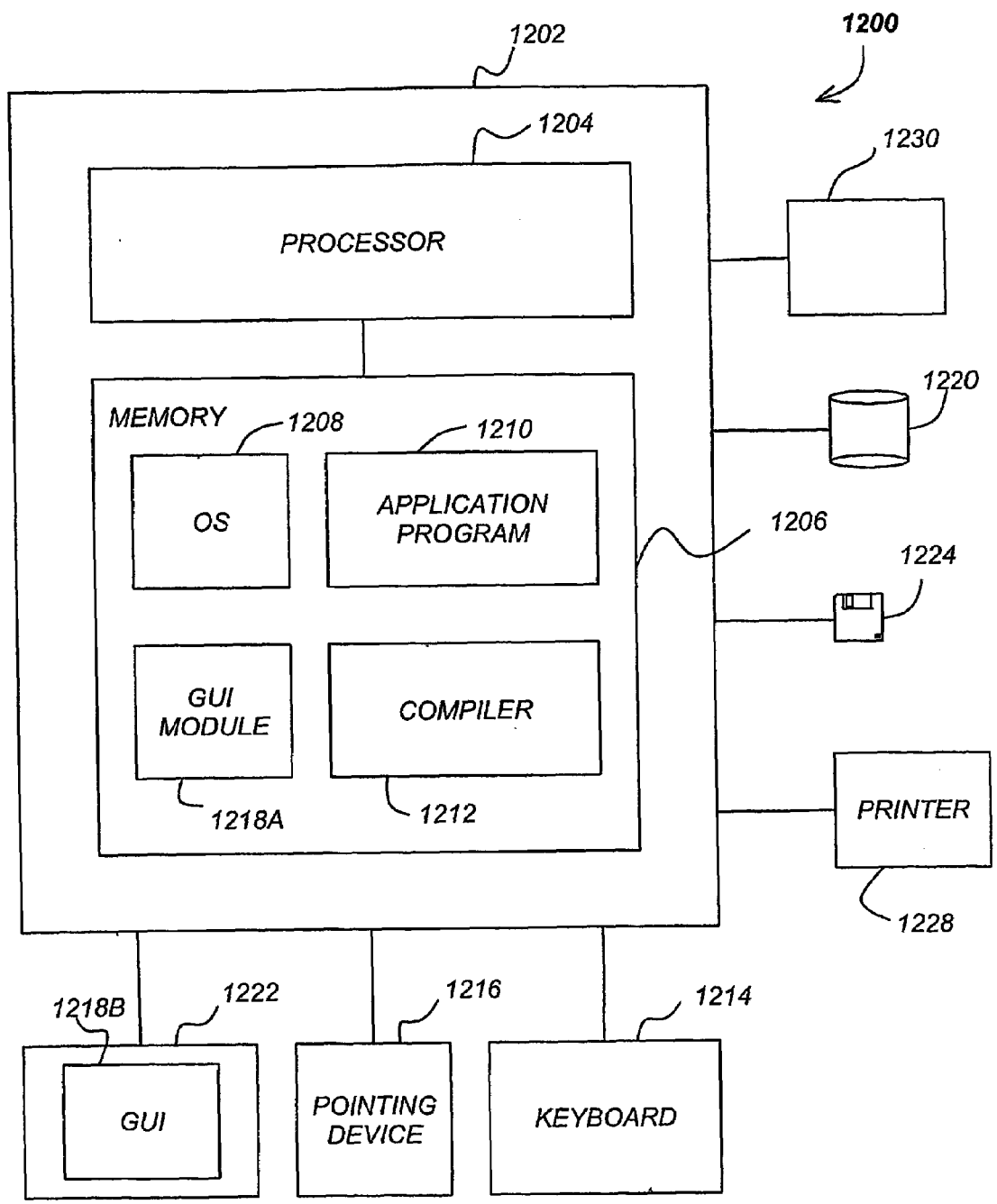
FIG. 12 illustrates an exemplary computer system that could be used to implement selected modules or functions the present invention.

FIG. 12 illustrates an exemplary computer system 1200 that could be used to implement selected modules and/or functions of the present invention. The computer 1202 comprises a processor 1204 and a memory 1206, such as random access memory (RAM). The computer 1202 is operatively coupled to a display 1222, which presents images such as windows to the user on a graphical user interface 1218B. The computer 1202 may be coupled to other devices, such as a keyboard 1214, a mouse device 1216, a printer, etc. Of course, those skilled in the art will recognize that any combination of the above components, or any number of different components, peripherals, and other devices, may be used with the computer 1202.

Generally, the computer 1202 operates under control of an operating system 1208 stored in the memory 1206, and interfaces with the user to accept inputs and commands and to present results through a graphical user interface (GUI) module 1218A. Although the GUI module 1218A is depicted as a separate module, the instructions performing the GUI functions can be resident or distributed in the operating system 1208, the computer program 1210, or implemented with special purpose memory and processors. The computer 1202 also implements a compiler 1212 which allows an application program 1210 written in a programming language such as COBOL, C++, FORTRAN, or other language to be translated into processor 1204 readable code. After completion, the application 1210 accesses and manipulates data stored in the memory 1206 of the computer 1202 using the relationships and logic that was generated using the compiler 1212. The computer 1202 also optionally comprises an external communication device such as a modem, satellite link, Ethernet card, or other device for communicating with other computers.

In one embodiment, instructions implementing the operating system 1208, the computer program 1210, and the compiler 1212 are tangibly embodied in a computer-readable medium, e.g., data storage device 1220, which could include one or more fixed or removable data storage devices, such as a zip drive, floppy disc drive 1224, hard drive, CD-ROM drive, tape drive, etc. Further, the operating system 1208 and the computer program 1210 are comprised of instructions which, when read and executed by the computer 1202, causes the computer 1202 to perform the steps necessary to implement and/or use the present invention. Computer program 1210 and/or operating instructions may also be tangibly embodied in memory 1206 and/or data communications devices 1230, thereby making a computer program product or article of manufacture according to the invention. As such, the terms "article of manufacture," "program storage device" and "computer program product" as used herein are intended to encompass a computer program accessible from any computer readable device or media.

Those skilled in the art will recognize many modifications may be made to this configuration without departing from the scope of the present invention. For example, those skilled in the art will recognize that any combination of the above components, or any number of different components, peripherals, and other devices, may be used with the present invention.

5. Estimating the Operating Point

Referring again to FIGS. 10A and 10B, non-linear distortion maps 1018 that depict the non-linearity of the TWTA may be used by a non-linear distortion map module during the layered modulation signal reconstruction process. However, it may be difficult to accurately determine the non-linearity and operating point of the TWTA (e.g., from received data in satellite communication) to produce a high-fidelity reconstructed signal, particularly for layered modulation applications. In this regard, as described above, in an exemplary receiver 802, a TWTA AM-AM and AM-PM map are applied (e.g., using an estimated operating point) to a re-encoded and re-modulated signal to more accurately reconstruct the upper layer signal.

Figure 13:
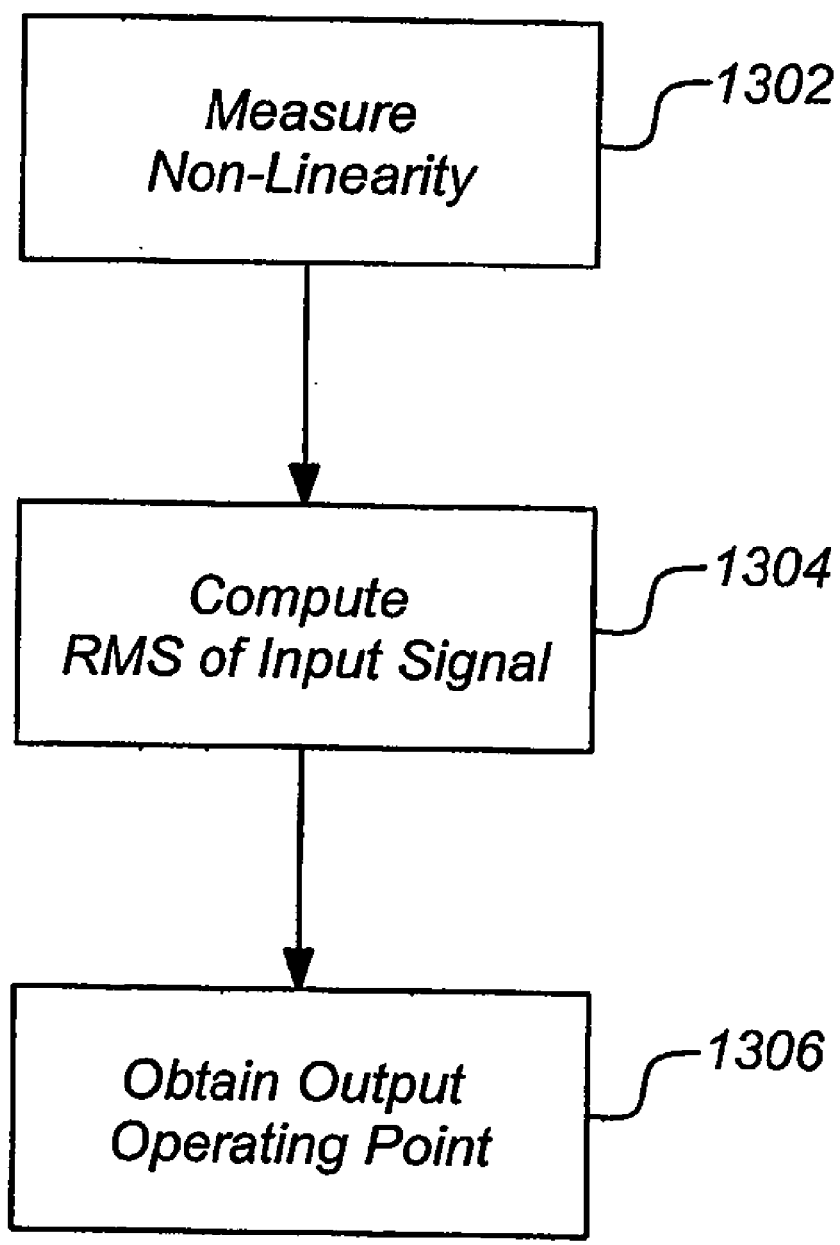
FIG. 13 is a flow chart illustrating the determination of the operating point in accordance with one or more embodiments of the invention.

While FIG. 10 illustrates the use of the non-linear distortion maps, knowledge of the non-linear distortion maps and operating point must be determined. FIG. 13 is a flow chart illustrating the determination of the operating point in accordance with one or more embodiments of the invention. At step 1302, TWTA non-linearity (i.e., the AM-AM and AM-PM curves) is measured (e.g. on-line). TWTA non-linearity may be measured in a variety of manners as described in further detail below.

Regardless of the technique used to measure TWTA non-linearity, the root-mean-squared (RMS) value of the input signal at the time of the non-linearity measurement (used to measure the curves) is computed at step 1304. The input signal refers to the reconstructed clean signal before the imposition of TWTA nonlinearity The RMS value identifies the input operating point on the measured nonlinearity curves.

The output operating point is then obtained at step 1306 (e.g., as a byproduct of the non-linearity measurement data). The output operating point may be obtained using a variety of methods. For example, the output operating point may be calculated from the RMS value of the output (received) values used to determine the TWTA non-linearity curve (e.g., when matching the curve as described below) less the estimated noise power value. The output operating point may also be obtained from the corresponding point on the measured TWTA non-linearity curves. With the input and output operating points obtained, the upper layer signal (of a layered modulation) may be more accurately reconstructed as part of the layered modulation scheme.

It should be noted that the measurement of non-linearity (i.e., step 1302) may be conducted in a variety of manners as part of the layered modulation scheme. Nonetheless, regardless of the technique used to measure non-linearity, the operating point is estimated along with the measurement for the non-linearity curves. The TWTA non-linearity may be measured at the local IRDs 500, in which case the operating point may be automatically calculated from the nonlinearity measurements. The TWTA non-linearity may also be made at a broadcast/uplink center 104 with the operating point similarly obtained, in which case information on TWTA non-linearity and operating point can be downloaded to individual IRDs 500, such as through the downlink signal 118, to support the layered modulation signal receiving process.

6. Measuring Non-Linearity

As described above, the measurement of non-linearity (i.e., step 1302) may be conducted in a variety of manners as part of the layered modulation scheme. A first mechanism for TWTA non-linearity measurement is fully described in U.S. patent application Ser. No. 10/165,710, entitled "SATELLITE TWTA ONLINE NON-LINEARITY MEASUREMENT", filed on Jun. 7, 2002 by Ernest C. Chen. A second measurement mechanism is fully described in U.S. Provisional Patent Application Ser. No. 60/510,368, entitled "IMPROVING TWTA AM-AM AND AM-PM MEASUREMENT", filed on Oct. 10, 2003, by Ernest C. Chen. The second mechanism represents an improvement over the first mechanism. Non-linearity may be measured in each local IRD 500 (e.g., using a coherent averaging technique that maximizes signal processing gains).

TWTA non-linearity may be measured locally within individual IRDs. This may, eliminate the need to transmit the non-linearity curves from the broadcast/uplink center 104. TWTA non-linearity can also be measured at the broadcast/uplink center 104 using a similar estimation procedure as that described above but possibly with a larger receive antenna for increased CNR as desired. The IRD 802 which receives the downlink signal 118 (e.g., from the LNB 502) may also include a signal processor which extracts the symbol stream and carrier frequency from the incoming signal and generates an ideal signal, i.e. a signal without the effects of the TWTA and noise. The ideal signal is then used in a comparison processor to produce TWTA characteristic maps (which provide the measurements for TWTA non-linearity). As described herein, the signal processor and comparison processor may be incorporated in IRD 802 within the tuner/demodulator 904, FEC 506. The details concerning the generation of the characteristic maps will be described below in the discussion of FIGS. 14A–14C.

Typically, the TWTA characteristic maps comprise measurements of the output amplitude modulation versus the input amplitude modulation (the AM-AM map) and the output phase modulation versus the input amplitude modulation (the AM-PM map). The received signal represents the TWTA amplifier output (plus noise) and the generated ideal signal represents the amplifier input. In addition to diagnosing and monitoring the amplifier, these characteristic maps may then be used to facilitate and/or improve reception of lower layer signals of a system using a layered modulation transmission scheme.

Figure 14A:
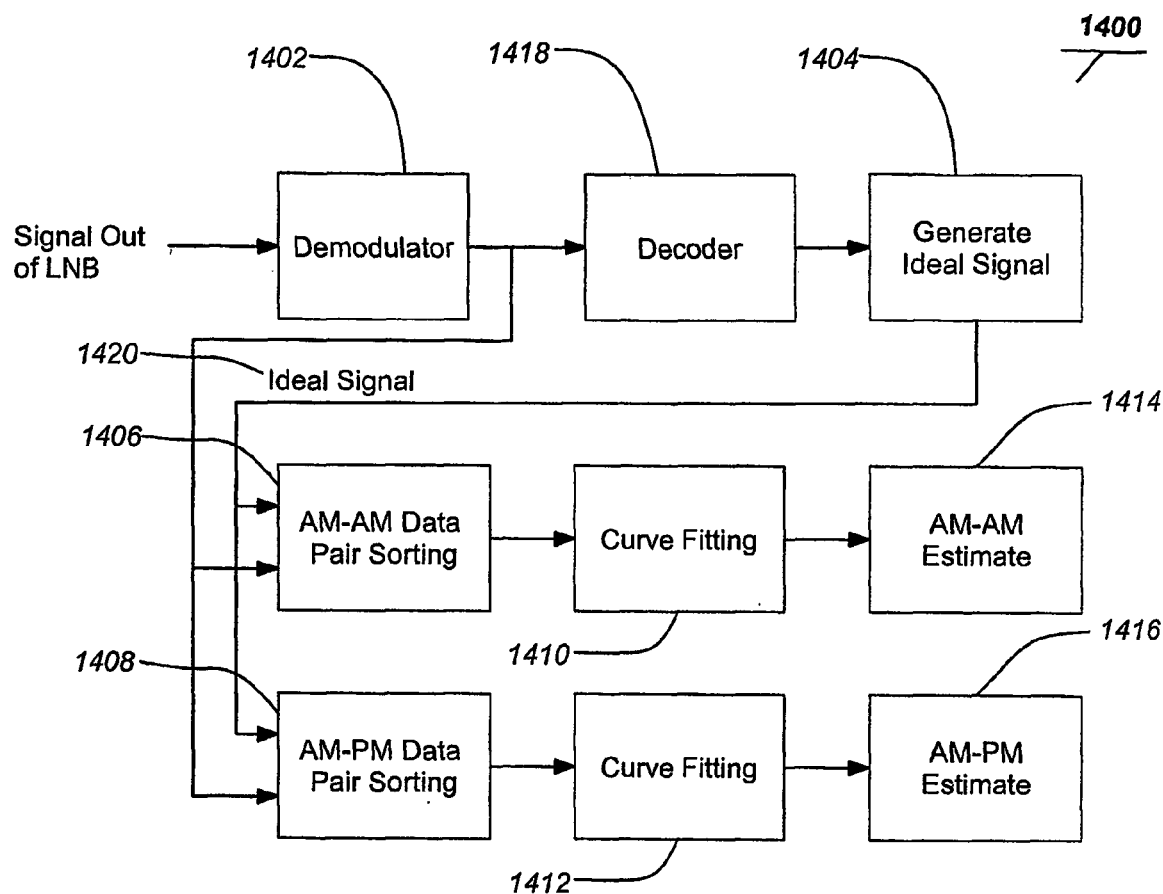
FIGS. 14A and 14B are block diagrams of a basic system for measuring performance maps in accordance with one or more embodiments of the invention.
Figure 14B:
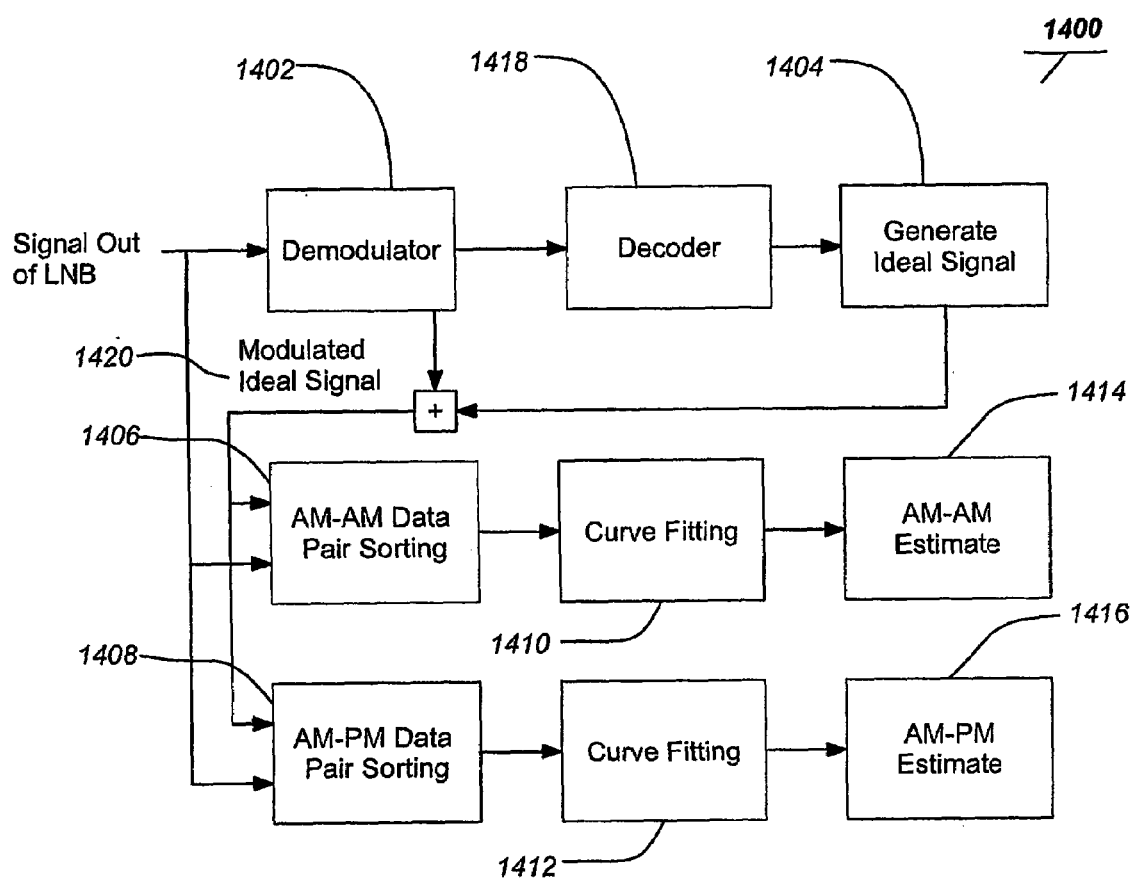

FIGS. 14A and 14B are block diagrams of the basic system 1400 for measuring the characteristic maps. All of the described functions may be carried out within a receiver 802 used in a direct broadcast satellite system having a basic architecture as described above. The appropriate signal section is captured and demodulated by demodulator 1402 which aligns symbol timing and removes any residual carrier frequency and phase in the signal. The demodulated signal is used in a signal generator 1404 to generate an ideal signal, i.e. one representing the pre-transmitted signal. In the case of a digital signal, the signal will be further decoded to obtain the signal symbols which will be used to generate the ideal signal. The difference between the ideal signal and the received signal is used by processors 1406, 1410, 1408, 1412 to estimate a transmission non-linearity characteristic. Only a small section of the received signal, on the order of a few thousand symbols, may be needed to obtain an estimate.

FIG. 14A depicts an embodiment where the non-linearity characteristic is estimated from a difference between the generated ideal signal (noise-free and without TWTA non-linearity) and the received signal after demodulation. Because the ideal signal is generated from only the symbols and symbol timing, obtaining the estimate from the received signal after demodulation simplifies the processing.

FIG. 14B depicts an embodiment where the performance characteristic is estimated from a difference between the ideal signal and the received signal before demodulation. In this case, the ideal signal must also be generated with the carrier frequency of the received signal. This may be done by adding the demodulated symbol timing and carrier frequency and phase to the ideal signal.

If necessary, forward error correction (FEC) may be applied to the demodulated signal as part of decoding to ensure that all recovered symbols are error-free.

In either embodiment (FIG. 14A or 14B) the ideal signal and the received signal are next used in processors 1406, 1408 to pair and sort data points of the two signals in a two-dimensional scattergram (a scattergram for purposes herein is the collection of paired points with input and output values represented along X and Y axes, respectively). These processors 1406, 1408 characterize a relationship between an input signal and an output signal of the amplifier plus noise. In this case, the input signal is represented by the generated ideal signal 1420 (re-modulated or otherwise) and the output signal is represented by the received signal. The X-axis of an AM-AM scattergram plots the magnitudes of the ideal signal samples with perfect TWTA linearity, and the Y-axis consists of the magnitudes of the received signal samples including the TWTA non-linearity (and noise). An AM-PM scattergram is similarly formed. The X-axis is the same as that for the AM-AM scattergram, and the Y-axis consists of all phase differences between the corresponding samples with and without TWTA non-linearity. Finally, the data points of the ideal signal and the corresponding data points of the received signal are processed by a processor 1410, 1412 to form a line through curve fitting, such as with a polynomial. The curve fitting processor 1410, 1412 may be separate or part of the processor 1406, 1408 which paired and sorted the data points. The result is an estimate of the desired performance characteristic of the TWTA 1414, 1416.

Figure 14C:
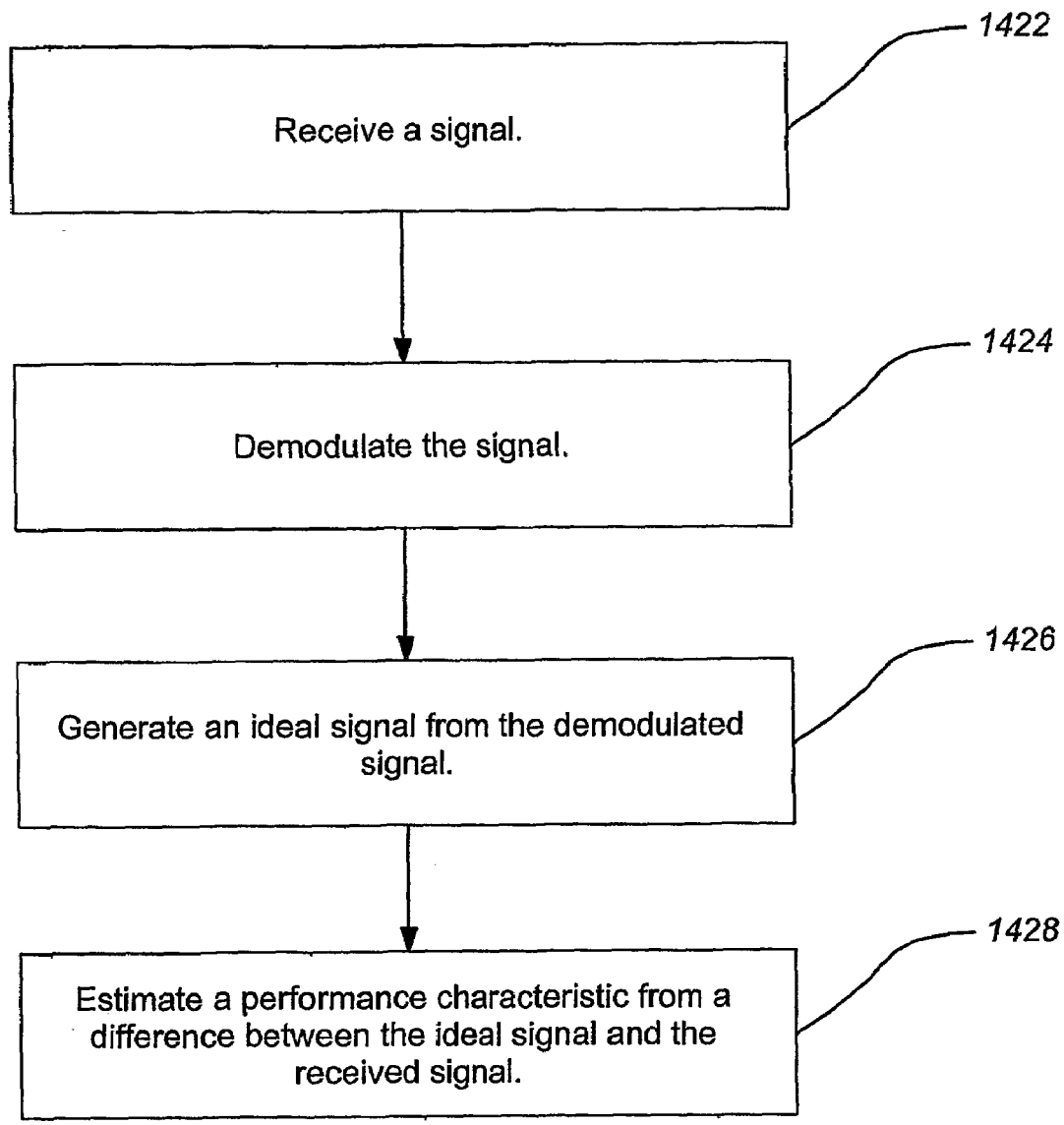
FIG. 14C is a flowchart illustrating a method for measuring performance maps in accordance with one or more embodiments of the invention.

FIG. 14C outlines the flow of a method of the present invention. A signal is received at block 1422. The signal is demodulated at block 1424. Then an ideal signal is generated from the demodulated signal at block 1426. Finally, a performance characteristic (i.e., a TWTA non-linearity curve) is estimated from a difference between the ideal signal and the received signal at block 1428.

7. Offsetting (Shifting) the TWTA Non-Linearity Measurements

Independent of the operating point estimation described above, the measured AM-AM and AM-PM curves may be deliberately offset or shifted to simplify the reconstruction of the upper layer signal during the signal reconstruction and cancellation process. Such an offset does not alter the performance of layered modulation processing (or non-linearity compensation performance). In fact, offsetting the operating point may result in a simple and consistent representation of TWTA non-linearity regardless of input saturation, input backoff, etc.

To offset the measurement curves, the input and output amplitude values (i.e., used during the non-linearity curve measurement) may be rescaled so that the operating point is at a desired reference point (e.g., 0 dB), for both input and output (e.g., thereby providing referenced operating point values). In the log domain, such resealing may be performed by subtracting the measured (AM) input operating point value (in dB) from all input values (in dB). Likewise, the measured output (AM) operating point value (in dB) may be subtracted from values of all output points (in dB). Thus, by offsetting the measurement curves, the curves may be more easily referenced. In silicon and other hardware implementations, however, it may be desirable to scale the input and output operating points or signals back (e.g., to −3 dB or −5 dB) to avoid signal saturation or fractional value representation overflow for incoming and outgoing signals. The shifting process can be done similarly to that described above.

With a shifted AM scale as desired, the output PM value may also be rescaled by subtracting the measured (angular) phase value at the output operating point from the phase value of all output points.

Figure 15A:
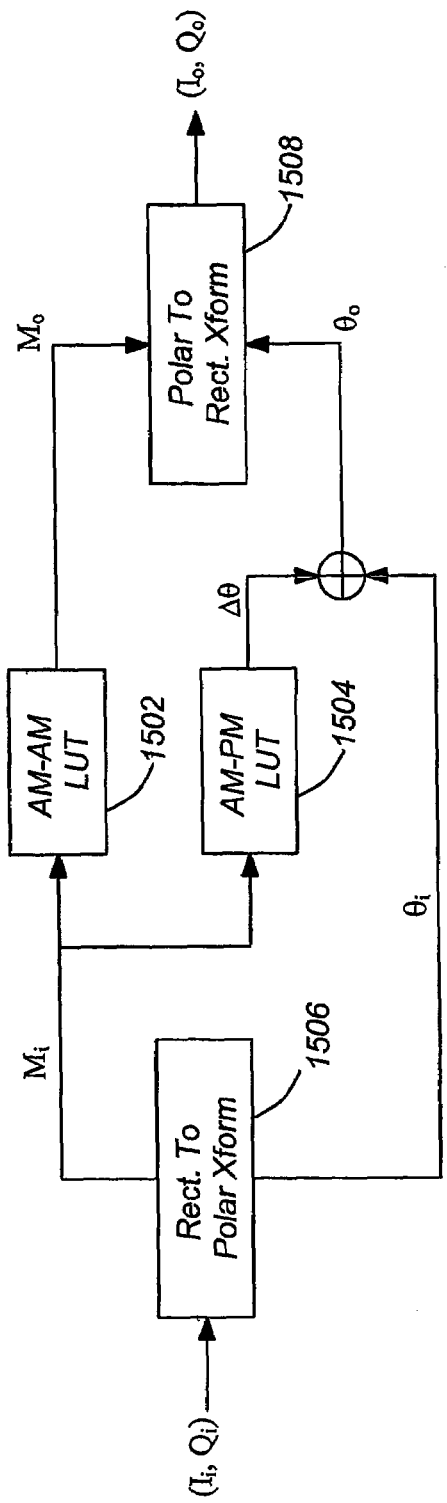
FIG. 15A illustrates an intuitive algorithm for obtaining the output in-phase and quadrature components in accordance with one or more embodiments of the invention.

The results of the above scaling is that the operating point will provide reference values, such as (0 dB, 0 dB) for the AM-AM map, and (0 dB, 0) for the AM-PM map. In this case the input signal must be scaled to 0 dB to match the operating point. To guard against signal saturation errors (and to avoid the need for a look-up-table [LUT] extrapolation), bounding points may be placed beyond the measured signal interval to allow interpolation of the input data (or output testing data) in the testing process that falls outside of the range of a TWTA measurement table. The values for the bounding points may be obtained by extrapolating or replicating values from the endpoints of the TWTA measurement table 8. Signal Reconstruction with Complex Number Multiplications Signal reconstruction with TWTA non-linearity, as described above, may be efficiently achieved with complex number multiplications. FIG. 15A illustrates an intuitive algorithm for obtaining the output in-phase and quadrature components ($I_o$, $Q_o$) (that may be accomplished with separate amplitude 1502 and phase 1504 corrections as indicated) from the input in-phase and quadrature components ($I_i$, $Q_i$). In FIG. 15A, the TWTA non-linearity effect is emulated with a multiplication on input data. As illustrated, the input in-phase and quadrature components are processed through computationally-intensive rectangular-to-polar transformations 1506 (and the inverse 1508). The non-linearity is first represented by two tables 1502 and 1504:

Table 1502=AM-AM:$M_i \Rightarrow M_o$;

Table 1504=AM-PM:$M_i \Rightarrow \Delta\theta$, such that $$M_i \exp(j\theta_i) \Rightarrow M_o \exp(j(\theta_i + \Delta\theta))$$

Thus, the amplitude lookup table 1502 is used to produce an output magnitude $M_o$. The above equation may be equated with the desired output expression:

$$M_o \exp(j(\theta_i+\Delta\theta)) = M_i \exp(j\theta_i) M_w \exp(j\theta_w) \text{ (where } M_w \exp(j\theta_w) \text{ is the multiplier for distortion) where}$$

$$M_w = \frac{M_o}{M_i} \text{ and } \theta_w = \Delta\theta.$$

(Likewise, pre-distortion would be achieved by $\exp(-j\theta_w)/M_w$). Accordingly, the phase lookup table 1504 is used to produce the change in output phase $\Delta\theta$. The change in output phase $\Delta\theta$ is then added to the input phase $\theta_i$ to produce the output phase $\theta_o$. The output magnitude $M_o$ and output phase $\theta_o$ are then processed through a polar-to-rectangular transformation 1508 to produce the output in-phase and quadrature components ($I_o$, $Q_o$).

Figure 15B:
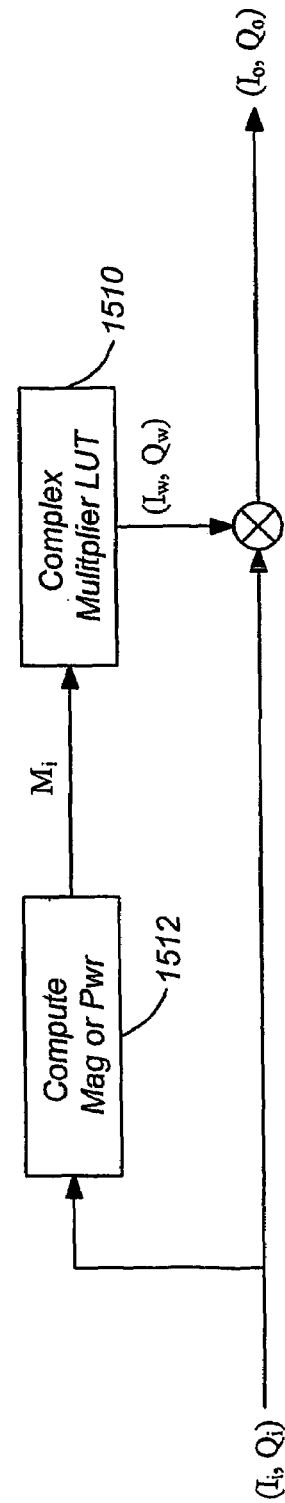
FIG. 15 B illustrates a computationally efficient algorithm for obtaining the input and output operating points in accordance with one or more embodiments of the invention.
Figure 16A:
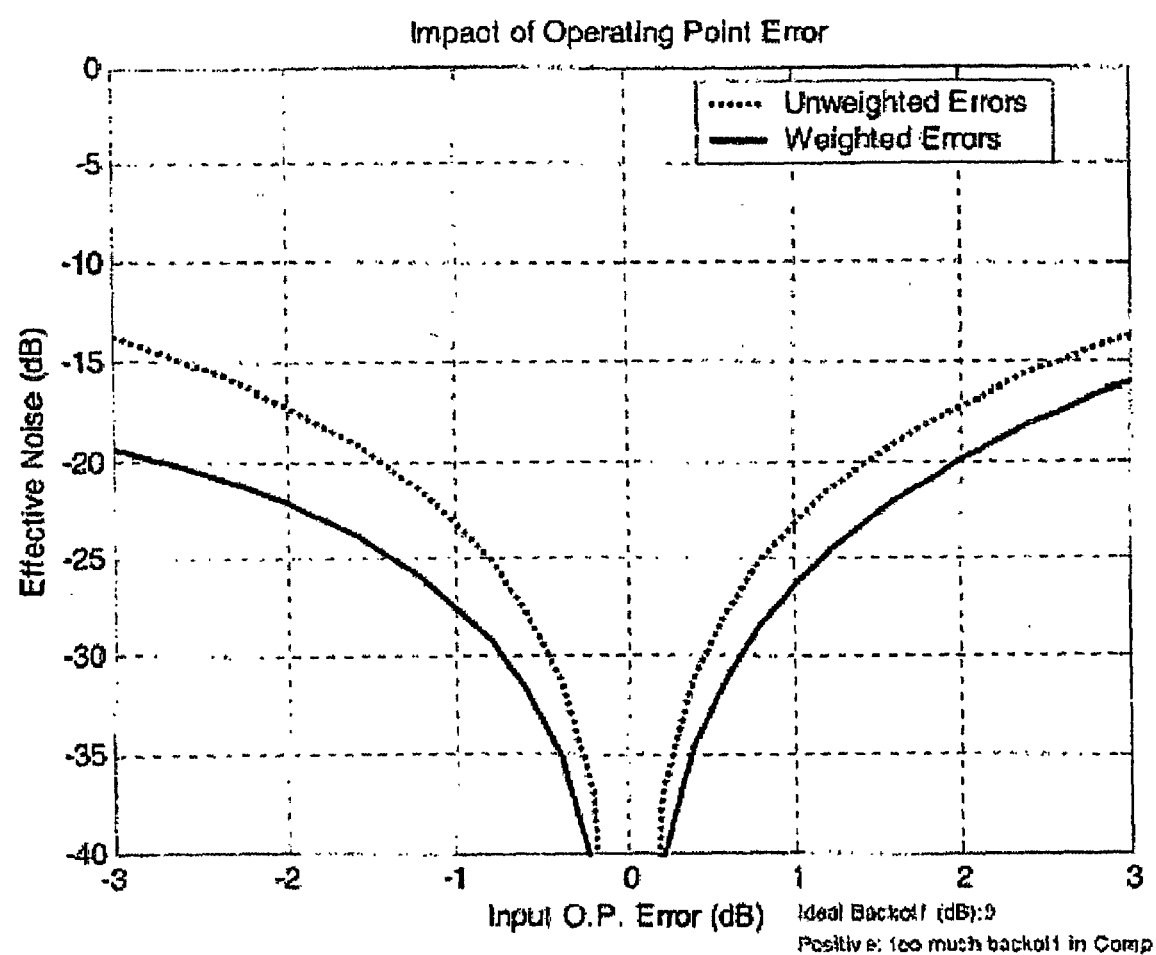
FIGS. 16A and 16B illustrate the impact of operating point errors in signal reconstruction.
Figure 16B:
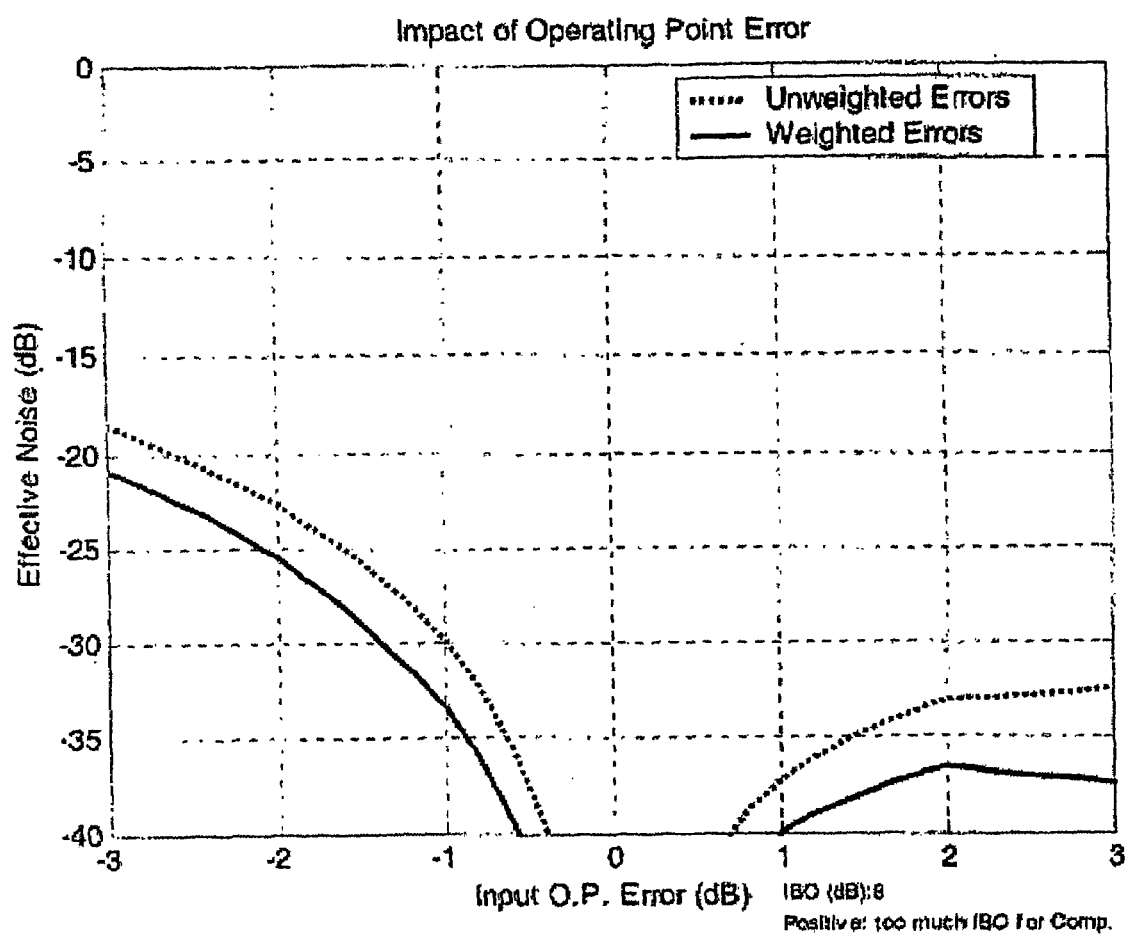

FIG. 15B illustrates a computationally efficient algorithm for obtaining the input and output operating points ($I_O$, $Q_O$). In FIG. 15B, the LUTs (in (M, $\theta$)) 1502 and 1504 (in FIG. 15A) are replaced with one complex multiplier LUT 1510 in (I,Q). The entries of the LUT is calculated from:

$$I_w + jQ_w = M_w \exp(j\Delta\theta_w)$$

The efficient algorithm begins with at 1512 with a computation of the signal power. The signal power computation 1512 is followed by a table lookup 1510 using the input signal power to index the proper complex multiplier ($I_w$, $Q_w$). The complex multiplier ($I_w$, $Q_w$) is then multiplied with the incoming complex-valued data to effect the TWTA distortion distortion:

$$I_o + jQ_o = (I_i + jQ_i)(I_w + jQ_w)$$

Accordingly, the efficient scheme of FIG. 15B avoids computationally intensive rectangular-to-polar and inverse transformations 1506 and 1508 and requires simple power formation 1512 and a complex number multiplication through an LUT 1510. In addition, the efficient scheme may include a complex matching factor in the complex multiplier table 1510, the matching factor being the magnitude and phase difference between the upper and lower layer components of a layered modulation signal if desired.

CONCLUSION

This concludes the description of the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching. For example, it is noted that the uplink configurations depicted and described in the foregoing disclosure can be implemented by one or more hardware modules, one or more software modules defining instructions performed by a processor, or a combination of both.

It is intended that the scope of the invention be limited not by this detailed description, but rather by the claims appended hereto. The above specification, examples and data provide a complete description of the manufacture and use of the apparatus and method of the invention. Since many embodiments of the invention can be made without departing from the scope of the invention, the invention resides in the claims hereinafter appended.

What is claimed is:

1. A method for determining an input operating point and an output operating point on a non-linear traveling wave tube amplifier (TWTA), comprising:
   measuring non-linearity of the TWTA;
   computing an input root-mean-square (RMS) value of an input signal used to measure the non-linearity of the TWTA, wherein the input RMS value identifies an input operating point of the measured non-linearity of the TWTA; and
   obtaining an output operating point.

2. The method of claim 1, wherein the measuring the non-linearity of the TWTA comprises measuring the non-linearity at a local receiver.

3. The method of claim 1, wherein the measuring the non-linearity of the TWTA comprises measuring the non-linearity at a broadcast center.

4. The method of claim 3, further comprising downloading the measured non-linearity and the output operating point to an individual receiver.

5. The method of claim 1, wherein obtaining the output operating point comprises calculating an output RMS value of output signals used in measuring the non-linearity of the TWTA.

6. The method of claim 1, wherein obtaining the output operating point comprises obtaining a corresponding point on the measured TWTA non-linearity based on the input RMS value.

7. The method of claim 1, further comprising reconstructing an upper layer signal of a layered modulation based on the output operating point.

8. The method of claim 1, further comprising offsetting the measured non-linearity to provide referenced operating point values.

9. The method of claim 8, wherein the offsetting comprises scaling an input amplitude value and output amplitude value of the measured non-linearity of the TWTA to place the input and output operating points at desired points.

10. The method of claim 9, wherein the scaling comprises subtracting a measured input operating point value from all input values in a log domain.

11. The method of claim 9, wherein the scaling comprises subtracting a measured output operating point value from all output values in a log domain.

12. The method of claim 9, wherein the scaling comprises subtracting a measured phase value at the output operating point from phase values of all output points used to measure the non-linearity of the TWTA.

13. The method of claim 9, wherein the scaling further comprises:
   placing bounding points beyond end points used to measure the non-linearity; and
   interpolating output testing data that falls outside of the measured non-linearity based on the bounding points.

14. The method of claim 8, further comprising mapping the input operating point and output operating point to a particular level to avoid signal saturation or fractional value representation overflow.

15. An apparatus for determining an input operating point and an output operating point on a non-linear traveling wave tube amplifier (TWTA), comprising:
   means for measuring a non-linearity of the TWTA;
   means for computing an input root-mean-square (RMS) value of an input signal used to measure the nonlinearity of the TWTA, wherein the input RMS value identifies an input operating point of the measured non-linearity of the TWTA; and
   means for obtaining an output operating point.

16. The apparatus of claim 15, wherein the means for measuring the non-linearity of the TWTA comprises means for measuring the non-linearity at a local receiver.

17. The apparatus of claim 15, wherein the means for measuring the non-linearity of the TWTA comprises means for measuring the non-linearity at a broadcast center.

18. The apparatus of claim 17, further comprising means for downloading the measured non-linearity and the output operating point to an individual receiver.

19. The apparatus of claim 15, wherein the means for obtaining the output operating point comprises means for calculating an output RMS value of output signals used in measuring the non-linearity of the TWTA.

20. The apparatus of claim 15, wherein the means for obtaining the output operating point comprises means for obtaining a corresponding point on the measured TWTA non-linearity based on the input RMS value.

21. The apparatus of claim 15, further comprising means for reconstructing an upper layer signal of a layered modulation based on the output operating point.

22. The apparatus of claim 15, further comprising means for offsetting the measured non-linearity to provide referenced operating point values.

23. The apparatus of claim 22, wherein the means for offsetting comprises means for scaling an input amplitude value and output amplitude value of the measured non-linearity of the TWTA to place the input and output operating point at desired points.

24. The apparatus of claim 23, wherein the means for scaling comprises means for subtracting a measured input operating point value from all input values in a log domain.

25. The apparatus of claim 23, wherein the means for scaling comprises means for subtracting a measured output operating point value from all output values in a log domain.

26. The apparatus of claim 23, wherein the means for scaling comprises means for subtracting a measured phase value at the output operating point from phase values of all output points used to measure the non-linearity of the TWTA.

27. The apparatus of claim 23, wherein the means for scaling further comprises:
   means for placing bounding points beyond end points used to measure the non-linearity; and
   means for interpolating output testing data that falls outside of the measured non-linearity based on the bounding points.

28. The apparatus of claim 22, further comprising means for mapping the input operating point and output operating point to a particular level to avoid signal saturation or fractional value representation overflow.

29. A system for determining an input operating point and an output operating point on a non-linear traveling wave tube amplifier (TWTA), comprising:
   (a) a measuring module configured to:
      (1) measure non-linearity of the TWTA; and
      (2) obtaining an output operating point; and
   (b) a non-linear distortion map module configured to compute an input root-mean-square (RMS) value of an input signal used to measure the non-linearity of the TWTA, wherein the RMS value identifies an input operating point of the measured non-linearity of the TWTA.

30. The system of claim 29, wherein the measuring module is located at a local receiver.

31. The system of claim 29, wherein the measuring module is located at a broadcast center.

32. The system of claim 31, further comprising a receiver configured to download the measured non-linearity and the output operating point.

33. The system of claim 29, wherein the measuring module is configured to obtain the output operating point by calculating an output RMS value of output signals used in measuring the non-linearity of the TWTA.

34. The system of claim 29, wherein the measuring module is configured to obtain the output operating point by obtaining a corresponding point on the measured TWTA non-linearity based on the input RMS value.

35. The system of claim 29, further comprising a receiver configured to reconstruct an upper layer signal of a layered modulation based on the output operating point.

36. The system of claim 29, further comprising a receiver configured to offset the measured non-linearity to provide referenced operating point values.

37. The system of claim 36, wherein the receiver is configured to offset the measured non-linearity by scaling an input amplitude value and output amplitude value of the measured non-linearity of the TWTA to place the input and output operating point at desired points.

38. The system of claim 37, wherein the receiver is configured to scale by subtracting a measured input operating point value from all input values in a log domain.

39. The system of claim 37, wherein the receiver is configured to scale by subtracting a measured output operating point value from all output values in a log domain.

40. The system of claim 37, wherein the receiver is configured to scale by subtracting a measured phase value at the output operating point from phase values of all output points used to measure the non-linearity of the TWTA.

41. The system of claim 37, wherein the receiver is further configured to scale by:
   placing bounding points beyond end points used to measure the non-linearity; and
   interpolating output testing data that falls outside of the measured non-linearity based on the bounding points.

42. The system of claim 36, wherein the receiver is further configured to map the input operating point and output operating point to a particular level to avoid signal saturation or fractional value representation overflow.

43. The method of claim 2, wherein the step of measuring the non-linearity of the TWTA comprises:
   generating a difference between an ideal signal and a received signal.

44. The method of claim 43, wherein generating a difference between an ideal signal and a received signal comprises:
   demodulating the received signal;
   decoding the demodulated signal;
   generate the ideal signal; and
   subtracting the ideal signal from the demodulated signal.

45. The method of claim 43, wherein generating a difference between an ideal signal and a received signal comprises:
   demodulating the received signal;
   decoding the demodulated signal;
   generating the ideal signal with a carrier of the received signal;
   subtracting the ideal signal from the received signal.

46. The method of claim 2, wherein the means for of measuring the non-linearity of the TWTA comprises:
   generating a difference between an ideal signal and a received signal.

47. The method of claim 43, wherein generating a difference between an ideal signal and a received signal comprises;
   demodulating the received signal;
   decoding the demodulated signal;
   generate the ideal signal; and
   subtracting the ideal signal from the demodulated signal.

48. The method of claim 43, wherein generating a difference between an ideal signal and a received signal comprises:
   demodulating the received signal;
   decoding the demodulated signal;
   generating the ideal signal with a carrier of the received signal;
   subtracting the ideal signal from the received signal.

* * * * *